US011880257B2

(12) United States Patent
Tang

(10) Patent No.: US 11,880,257 B2
(45) Date of Patent: *Jan. 23, 2024

(54) MEMORY SYSTEM AND PEAK POWER MANAGEMENT FOR MEMORY DIES OF THE MEMORY SYSTEM

(71) Applicant: Yangtze Memory Technologies Co., Ltd., Hubei (CN)

(72) Inventor: Qiang Tang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/941,873

(22) Filed: Sep. 9, 2022

(65) Prior Publication Data

US 2023/0004205 A1  Jan. 5, 2023

Related U.S. Application Data

(63) Continuation of application No. 17/242,857, filed on Apr. 28, 2021, now Pat. No. 11,449,122, which is a (Continued)

(51) Int. Cl.
*G06F 1/3225* (2019.01)
*G06F 1/3234* (2019.01)

(52) U.S. Cl.
CPC .......... *G06F 1/3225* (2013.01); *G06F 1/3275* (2013.01)

(58) Field of Classification Search
CPC ........ G06F 1/3225; G06F 1/3275; G06F 1/28; G06F 1/305; G06F 1/3296; G06F 30/373;
(Continued)

(56) References Cited

U.S. PATENT DOCUMENTS 8,144,496 B2   3/2012 Cheng
9,171,889 B2   10/2015 Yi et al.
(Continued)

FOREIGN PATENT DOCUMENTS

CN    102483729 A    5/2012
CN    112088406 A    12/2020
(Continued)

OTHER PUBLICATIONS

International Search Report of the International Searching Authority directed to related International Patent Application No. PCT/CN2021/075725, dated Jul. 30, 2021; 4 pages.

*Primary Examiner* — Kim Huynh
*Assistant Examiner* — Cory A. Latham
(74) *Attorney, Agent, or Firm* — Sterne, Kessler, Goldstein & Fox P.L.L.C.

(57) ABSTRACT

A method of peak power management (PPM) is provided for two NAND memory dies. each NAND memory die comprises a PPM circuit having a PPM contact pad held at an electric potential common between the two NAND memory dies. The method includes the following steps: detecting the electric potential during a first peak power check (PPC) routine for the first NAND memory die; driving the electric potential to a second voltage level if the detected electric potential is at a first voltage level higher than the second voltage level; generating a pausing signal in the electric potential to pause a second PPC routine for the second NAND memory die if no pausing signal is detected; and generating a resuming signal in the electric potential to resume the second PPC routine for the second NAND memory die after the first NAND memory die completes a first peak power operation.

12 Claims, 11 Drawing Sheets

Related U.S. Application Data continuation of application No. PCT/CN2021/075725, filed on Feb. 7, 2021.

(58) Field of Classification Search
CPC ....... G11C 8/12; G11C 16/0483; G11C 16/08; G11C 5/147; G11C 16/30
See application file for complete search history.

(56) References Cited

U.S. PATENT DOCUMENTS

| | | |
|---|---|---|
| 9,293,176 B2 | 3/2016 | Grunzke |
| 10,884,638 B1 | 1/2021 | Cariello et al. |
| 2013/0270631 A1 | 10/2013 | Kim et al. |
| 2016/0099228 A1 | 4/2016 | Franca-Neto |
| 2018/0136707 A1 | 5/2018 | Ha et al. |
| 2022/0044710 A1 | 2/2022 | Tang |
| 2022/0253122 A1 | 8/2022 | Tang |

FOREIGN PATENT DOCUMENTS

| | | |
|---|---|---|
| CN | 112133352 A | 12/2020 |
| KR | 10-2013-0116116 A | 10/2013 |
| KR | 101477648 B1 | 12/2014 |
| WO | WO 2021/011234 A1 | 1/2011 |

MEMORY SYSTEM AND PEAK POWER MANAGEMENT FOR MEMORY DIES OF THE MEMORY SYSTEM

CROSS-REFERENCE TO RELATED APPLICATIONS AND INCORPORATION BY REFERENCE

This application is a continuation of U.S. patent application Ser. No. 17/242,857 filed on Apr. 28, 2021 and titled "Peak Power Management for Multi-die Operations," which claims priority to PCT/CN2021/075725 filed on Feb. 7, 2021, all of which are incorporated herein by reference in their entirety.

TECHNICAL FIELD

The present disclosure generally relates to the field of semiconductor technology, and more particularly, to circuit designs and methods for peak power management in a storage system.

BACKGROUND

In many servers and mobile devices, a NAND storage system is widely used as the primary non-volatile storage device due to its high storage density and relatively low access latency. However, performance of a high density storage system, for example, a three-dimensional (3D) NAND storage system, is often restricted by the maximum amount of power (or peak current) that it can use. Currently, operations consuming high power (i.e., peak power operations) that are carried out by various memory dies of the NAND storage system can be staggered by a system controller. Only a limited number of peak power operations can be performed simultaneously. This approach can also result in increased system loading with unnecessary over-management. It is desirable to establish communications between different memory dies to coordinate the peak power operations. In the present disclosure, coordination between two or more memory dies can be arranged through a peak power management (PPM) circuit on each memory die, where the PPM contact pads of the PPM circuits can be held at the same electric potential. Peak power operations can be coordinated between two or more memory dies by regulating the electric potential of the PPM contact pads and by implementing a unique delay time period for each memory die.

BRIEF SUMMARY

One aspect of the present disclosure provides a method of peak power management (PPM) for multiple NAND memory dies. The multiple NAND memory dies have a first NAND memory die and a second NAND memory die, and each of the first NAND memory die and the second NAND memory die includes a PPM circuit having a PPM contact pad held at an electric potential common between the first NAND memory die and the second NAND memory die. The method includes the following steps: detecting the electric potential of the PPM contact pad at a first timing during a first peak power check (PPC) routine for the first NAND memory die; driving the electric potential of the PPM contact pad to a second voltage level if the detected electric potential is at a first voltage level at the first timing, wherein the second voltage level is lower than the first voltage level; enabling the first NAND memory die to wait for a first delay time period; determining whether there is a pausing signal in the electric potential of the PPM contact pad at a second timing during the first PPC routine for the first NAND memory die, wherein the second timing is later than the first timing; generating the pausing signal in the electric potential of the PPM contact pad to pause a second PPC routine for the second NAND memory die if no pausing signal is detected at the second timing; enabling the first NAND memory die to perform a first peak power operation; and generating a resuming signal in the electric potential of the PPM contact pad to resume the second PPC routine for the second NAND memory die after the first NAND memory die completes the first peak power operation.

In some embodiments, the method further includes detecting the electric potential of the PPM contact pad at a third timing during the second PPC routine for the second NAND memory die.

In some embodiments, the method further includes enabling the second NAND memory die to pause the second PPC routine if the detected electric potential is at the second voltage level at the third timing.

In some embodiments, the method further includes resuming the second PPC routine for the second NAND memory die in response to the resuming signal generated after the first NAND memory die completes the first peak power operation.

In some embodiments, the resuming the second PPC routine for the second NAND memory die includes driving the electric potential of the PPM contact pad to the second voltage level; and enabling the second NAND memory die to wait for a third delay time period, wherein the third delay time period of the second NAND memory die is different from the first delay time period of the first NAND memory die.

In some embodiments, the resuming the second PPC routine for the second NAND memory die further includes determining whether there is the pausing signal in the electric potential of the PPM contact pad at a fourth timing during the second PPC routine for the second NAND memory die, wherein the fourth timing is later than the third timing; and generating the pausing signal in the electric potential of the PPM contact pad to pause a third PPC routine for a third NAND memory die among the multiple NAND memory dies if no pausing signal is detected at the fourth timing.

In some embodiments, the resuming the second PPC routine for the second NAND memory die further includes enabling the second NAND memory die to perform a second peak power operation; and generating the resuming signal in the electric potential of the PPM contact pad to resume the third PPC routine for the third NAND memory die after the second NAND memory die completes the second peak power operation.

In some embodiments, the method further includes enabling the second NAND memory die to wait for a third delay time period if the detected electric potential is at the first voltage level at the third timing, wherein the third delay time period of the second NAND memory die is different from the first delay time period of the first NAND memory die.

In some embodiments, the method further includes determining whether there is the pausing signal in the electric potential of the PPM contact pad at a fourth timing during the second PPC routine for the second NAND memory die, wherein the fourth timing is later than the third timing.

In some embodiments, the method further includes pausing the second PPC routine for the second NAND memory die if the pausing signal is detected at the fourth timing.

In some embodiments, the method further includes resuming the second PPC routine for the second NAND memory die in response to the resuming signal generated after the first NAND memory die completes the first peak power operation.

In some embodiments, the method further includes prior to performing the first peak power operation, waiting for a second delay time period in the first PPC routine for the first NAND memory die.

In some embodiments, the generating the resuming signal includes driving the electric potential of the PPM contact pad to the first voltage level.

In some embodiments, the generating the pausing signal includes generating a positive pulse in the electric potential of the PPM contact pad, the positive pulse having a pulse width in a range between about 0.1 µS and about 10 µS.

In some embodiments, the determining whether there is the pausing signal comprises measuring the electric potential of the PPM contact pad at a first probing and a second probing, wherein the first probing and the second probing are separated with a measurement time period longer than the pulse width.

Another aspect of the present disclosure provides a peak power management (PPM) circuit for managing peak power operations between multiple NAND memory dies in a memory chip. The PPM circuit has a PPM contact pad held at an electric potential common between the PPM circuit disposed on a first NAND memory die and the PPM circuit disposed on a second NAND memory die. The PPM circuit is configured to detect the electric potential of the PPM contact pad at a first timing during a first peak power check (PPC) routine for the first NAND memory die; drive the electric potential of the PPM contact pad to a second voltage level if the detected electric potential is at a first voltage level at the first timing, wherein the second voltage level is lower than the first voltage level; enable the first NAND memory die to wait for a first delay time period; determine whether there is a pausing signal in the electric potential of the PPM contact pad at a second timing during the first PPC routine for the first NAND memory die, wherein the second timing is later than the first timing; generate the pausing signal in the electric potential of the PPM contact pad to pause a second PPC routine for the second NAND memory die if no pausing signal is detected at the second timing; enable the first NAND memory die to perform a first peak power operation; and generate a resuming signal in the electric potential of the PPM contact pad to resume the second PPC routine for the second NAND memory die after the first NAND memory die completes the first peak power operation.

In some embodiments, the PPM circuit is further configured to detect the electric potential of the PPM contact pad at a third timing during the second PPC routine for the second NAND memory die.

In some embodiments, the PPM circuit is further configured to enable the second NAND memory die to pause the second PPC routine if the detected electric potential is at the second voltage level at the third timing.

In some embodiments, the PPM circuit is further configured to resume the second PPC routine for the second NAND memory die in response to the resuming signal generated after the first NAND memory die completes the first peak power operation.

In some embodiments, the PPM circuit is further configured to drive the electric potential of the PPM contact pad to the second voltage level; enable the second NAND memory die to wait for a third delay time period, wherein the third delay time period of the second NAND memory die is different from the first delay time period of the first NAND memory die; determine whether there is the pausing signal in the electric potential of the PPM contact pad at a fourth timing during the second PPC routine for the second NAND memory die, wherein the fourth timing is later than the third timing; generate the pausing signal in the electric potential of the PPM contact pad to pause a third PPC routine for a third NAND memory die among the multiple NAND memory dies if no pausing signal is detected at the fourth timing; enable the second NAND memory die to perform a second peak power operation; and generate the resuming signal in the electric potential of the PPM contact pad to resume the third PPC routine for the third NAND memory die after the second NAND memory die completes the second peak power operation.

In some embodiments, the PPM circuit is further configured to pause the second PPC routine for the second NAND memory die if the pausing signal is detected at the fourth timing.

In some embodiments, the resuming signal comprises the first voltage level in the electric potential of the PPM contact pad.

In some embodiments, the pausing signal comprises a positive pulse in the electric potential of the PPM contact pad, the positive pulse having a pulse width in a range between about 0.1 µS and about 10 µS.

In some embodiments, the PPM circuit further includes a first pull-up driver electrically connected to a first power source and a first end of a PPM resistor; a second pull-up driver electrically connected to a second power source and a second end of the PPM resistor; a pull-down driver electrically connected to the second end of the PPM resistor, wherein the PPM contact pad is connected to the second end of the PPM resistor.

In some embodiments, the PPM circuit also includes a comparator with a first input terminal electrically connected to a reference voltage and a second input terminal electrically connected to the PPM contact pad.

In some embodiments, the electric potential of the PPM contact pad is higher than the reference voltage when the pull-down driver is switched off, and the electric potential of the PPM contact pad is lower than the reference voltage when the pull-down driver is switched on.

In some embodiments, the first pull-up driver and the second pull-up driver include p-channel metal oxide semiconductor field effect transistors (MOSFETs).

In some embodiments, the pull-down driver comprises an n-channel metal oxide semiconductor field effect transistor (MOSFET).

In some embodiments, the PPM contact pad of the PPM circuit on the first NAND memory die is electrically connected to the PPM contact pad of the PPM circuit on the second NAND memory die through a die-to-die connection. In some embodiments, the die-to-die connection includes a metal interconnect formed by flip-chip bonding, die-to-die bonding, or wire-bonding.

Yet another aspect of the present disclosure provides a peak power management (PPM) system for managing peak power operations between multiple NAND memory dies. The PPM system includes a PPM circuit on each of the multiple NAND memory dies as described above.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figures 1A, 1B:
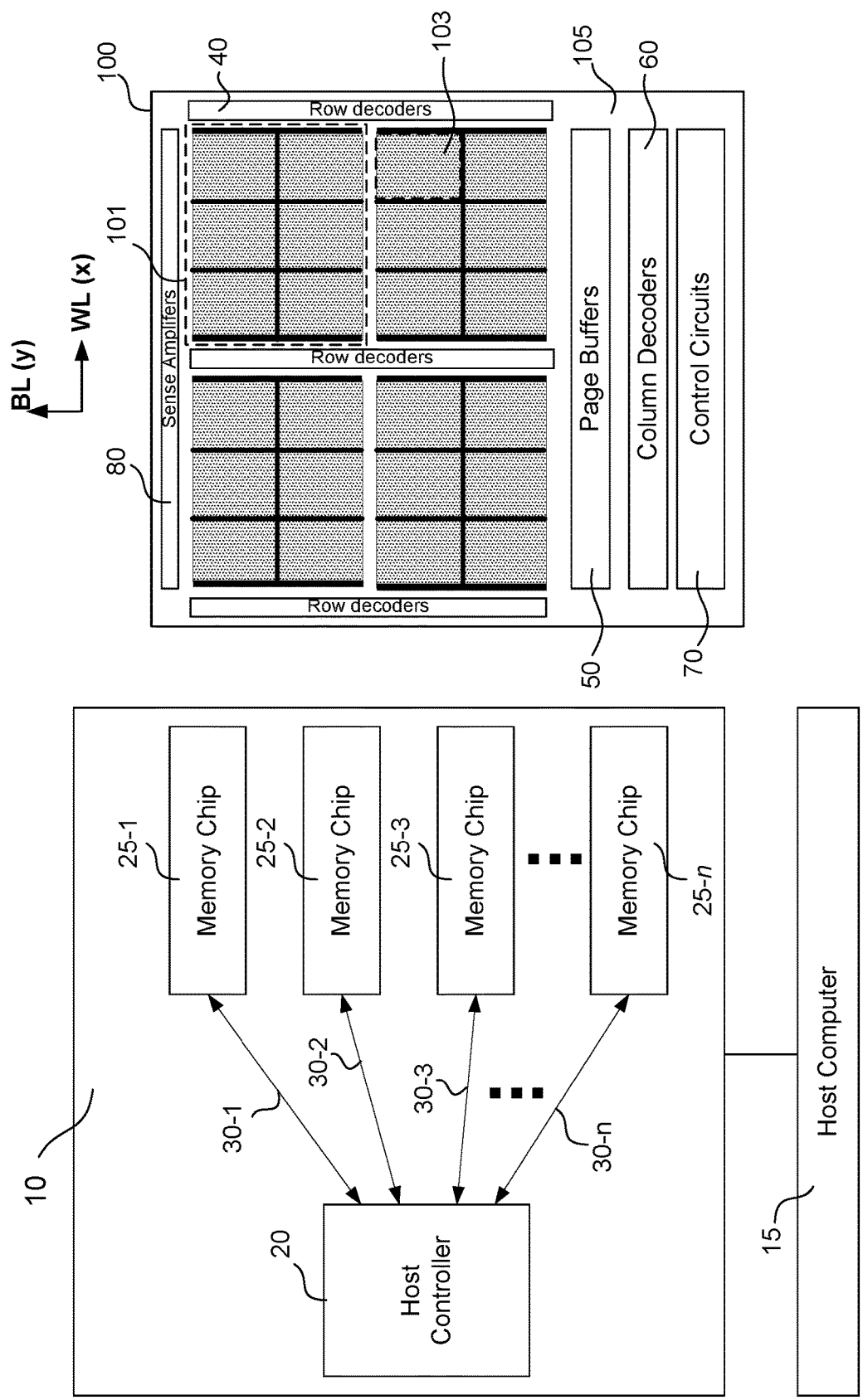
FIG. 1A illustrates a storage system with one or more memory chips, according to some embodiments of the present disclosure.
FIG. 1B illustrates a top-down view of a memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

FIG. 1A illustrates a storage system 10, according to some embodiments of the present disclosure. The storage system 10 (also referred to as a NAND storage system or a solid state drive) can include a host controller 20 and one or more memory chips 25-1, 25-2, 25-3, . . . , 25-n. Each semiconductor memory chip 25 (hereafter just "memory chip") can be a NAND chip (i.e., "flash," "NAND flash" or "NAND"). The solid state drive (SSD) 10 can communicate with a host computer 15 through the host controller 20, where the host controller 20 can be connected to the one or more memory chips 25-1, 25-2, 25-3, . . . , 25-n, via one or more memory channels 30-1, 30-2, 30-3, . . . , 30-n. In some embodiments, each memory chip 25 can be managed by the host controller 20 via a memory channel 30.

The host computer 15 sends data to be stored at the NAND storage system or SSD 10 or retrieves data by reading the SSD 10. The host controller 20 can handle I/O requests received from the host computer 15, ensure data integrity and efficient storage, and manage the memory chip 25. The memory channels 30 can provide data and control communication between the host controller 20 and each memory chip 25 via a data bus. The host controller 20 can select one of the memory chip 25 according to a chip enable signal.

FIG. 1B illustrates a top-down view of a NAND flash memory 100, according to some embodiments of the present disclosure. The NAND flash memory 100 can be a memory die (or a die) or any portion of a memory die. In some embodiments, each memory chip 25 in FIG. 1A can include one or more memory dies, e.g., one or more NAND flash memories 100. In some embodiments, each NAND flash memory 100 can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1B, the exemplary NAND flash memory 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1B. In this disclosure, the memory block 103 is also referred to as the "memory array" or "array." The memory array is the core area on a memory die, performing storage functions.

The NAND flash memory 100 also includes a periphery region 105, an area surrounding memory planes 101. The periphery region 105 contains many digital, analog, and/or mixed-signal circuits to support functions of the memory array, for example, page buffers 50, row decoders 40, column decoders 60, control circuits 70 and sense amplifiers 80. Control circuits 70 include active and/or passive semiconductor devices, such as transistors, diodes, capacitors, resistors, etc., as would be apparent to a person of ordinary skill in the art.

It is noted that the layout of the electronic components in the SSD 10 and the NAND flash memory 100 in FIGS. 1A and 1B are shown as examples. The SSD 10 and the NAND flash memory 100 can have other layout and can include additional components. For example, the NAND flash memory 100 can also have high-voltage charge pumps, I/O circuits, etc. The SSD 10 can also include firmware, data scrambler, etc.

Figure 2A:
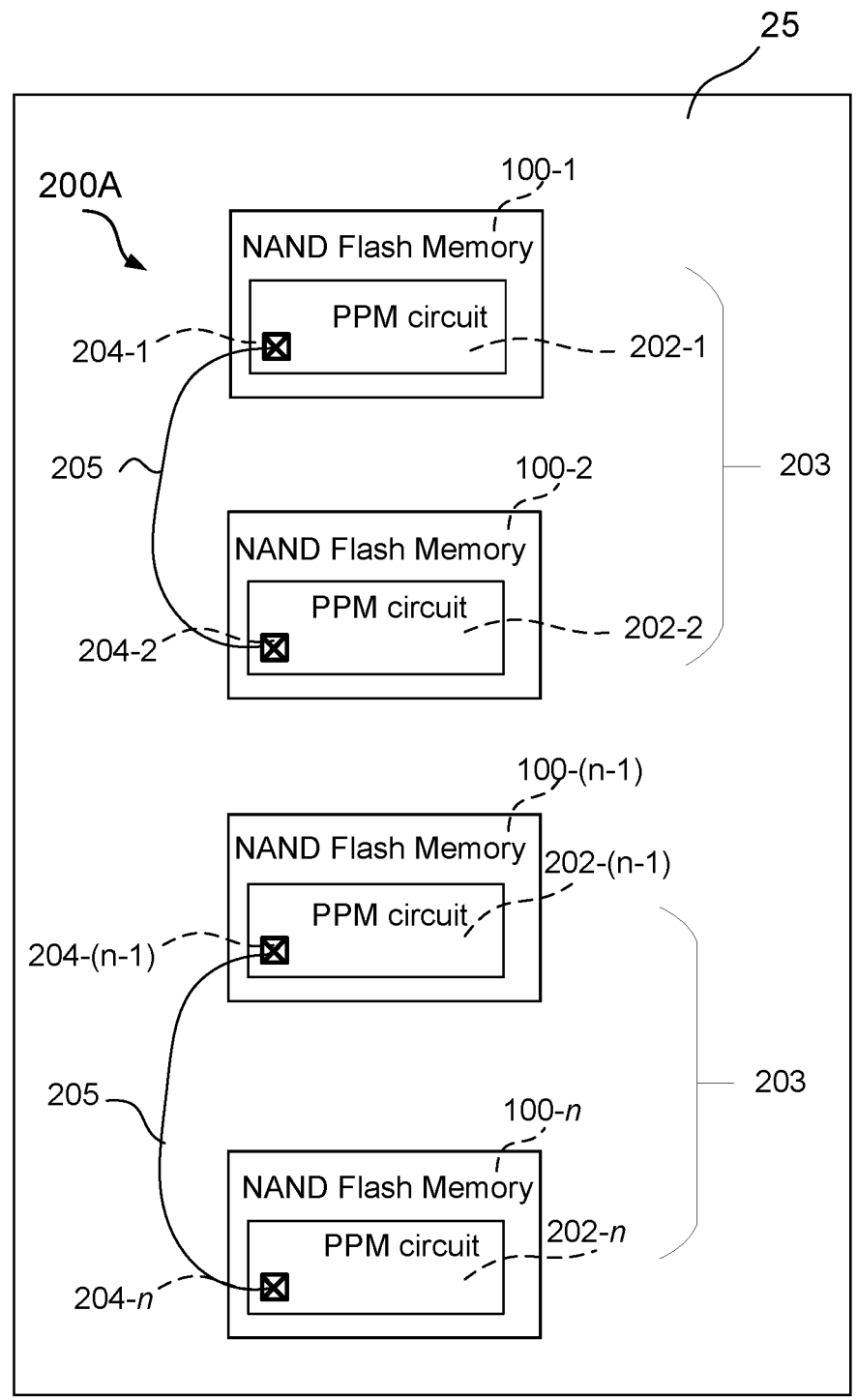
FIG. 2A illustrates a peak power management system in a memory chip, according to some embodiments of the present disclosure.

FIG. 2A illustrates a peak power management system 200A of the memory chip 25, according to some embodiments of the present disclosure. The peak power management (PPM) system 200A can be implemented in each memory chip 25 of the NAND storage system 10 in FIG. 1A, where each memory chip 25 can include a plurality of memory dies 100-1, 100-2, ..., 100-(n−1), 100-n, and each memory die can be similar to the NAND flash memory 100 discussed previously in reference with FIG. 1B. In some embodiments, each NAND flash memory 100 can include a peak power management (PPM) circuit 202 (e.g., 202-1, 202-2, ..., 202-(n−1), 202-n), where each PPM circuit 202 can include a PPM contact pad 204 (also referred to as PPM pin). The PPM circuits 202-1, 202-2, ..., 202-(n−1), 202-n on different NAND flash memories 100-1, 100-2, ..., 100-(n−1), 100-n of the memory chip 25 can communicate with each other through the PPM contact pads 204 (e.g., 204-1, 204-2, ..., 204-(n−1), 204-n). In some embodiments, the PPM contact pads 204 between two NAND flash memories 100 can be electrically connected with each other through a plurality of die-to-die connections 205. For example, the PPM contact pad 204-1 on the NAND flash memory 100-1 can be electrically connected with the PPM contact pad 204-2 on the NAND flash memory 100-2 through the die-to-die connection 205. The PPM contact pad 204-(n−1) on the NAND flash memory 100-(n−1) can also be electrically connected with the PPM contact pad 204-n on the NAND flash memory 100-n through the die-to-die connection 205. In some embodiments, the die-to-die connection 205 can be a metal interconnect formed by wire-bonding. In some embodiments, the metal interconnect can be a metal wire or any suitable metal or conductive material formed by flip-chip bonding or die-to-die bonding. In some embodiments, the metal interconnect can be formed by a through-silicon VIA (e.g, a through-array structure).

By using the die-to-die connections 205 described above, communications between two different memory dies (e.g., between NAND flash memories 100-1 and 100-2) can be established as a PPM group 203 in the PPM system 200A. As such, the NAND storage system 10 can send operation commands to the memory chip 25, where at any time the NAND storage system 10 can control the system's power consumption through the PPM circuit 202 by selecting one of the two memory dies in the PPM group 203.

Figure 2B:
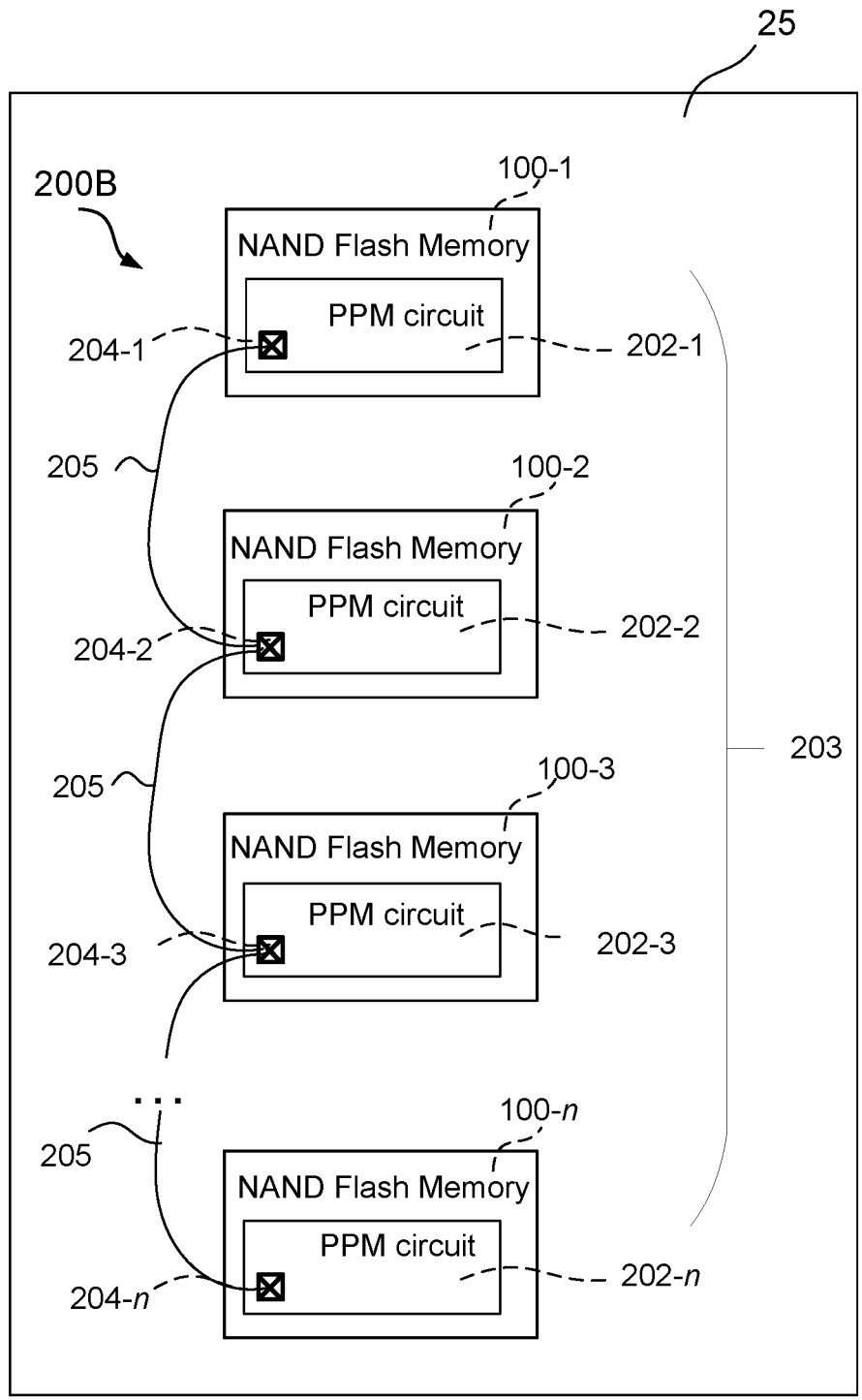
FIG. 2B illustrates another peak power management system in a memory chip, according to some embodiments of the present disclosure.

FIG. 2B illustrates a PPM system 200B, according to some embodiments of the present disclosure. Similar to the PPM system 200A, the PPM system 200B can also be implemented in each memory chip 25 of the NAND storage system 10 in FIG. 1A, where each memory die (e.g., NAND flash memory 100) includes one PPM circuit 202 (e.g., 202-1, 202-2, 202-3, ..., 202-n). Each PPM circuit 202 includes the PPM contact pad 204 (e.g., 204-1, 204-2, 204-3, ..., 204-n), through which the PPM circuits 202 on different NAND flash memories 100 can communicate with each other. In some embodiments, the PPM contact pads 204 between the NAND flash memories 100 can be electrically connected with each other through a plurality of die-to-die connections 205. For example, the PPM contact pad 204-1 on the NAND flash memory 100-1 can be electrically connected with the PPM contact pad 204-2 on the NAND flash memory 100-2 through the die-to-die connection 205, while the PPM contact pad 204-2 on the NAND flash memory 100-2 can be electrically connected with the PPM contact pad 204-3 on the NAND flash memory 100-3 through another die-to-die connection 205. As such, the PPM contact pads 204 for the entire PPM system 200B can be electrically connected through the die-to-die connection 205. In the other words, the PPM system 200B can be considered as one PPM group 203. Communications between different memory dies on the same memory chip can thereby be established through the PPM system 200B. The NAND storage system 10 can send operation commands to the memory chip 25, where at any time the NAND storage system 10 can control the system's power consumption through the PPM circuits 202 by selecting one of the memory dies.

Figure 3:
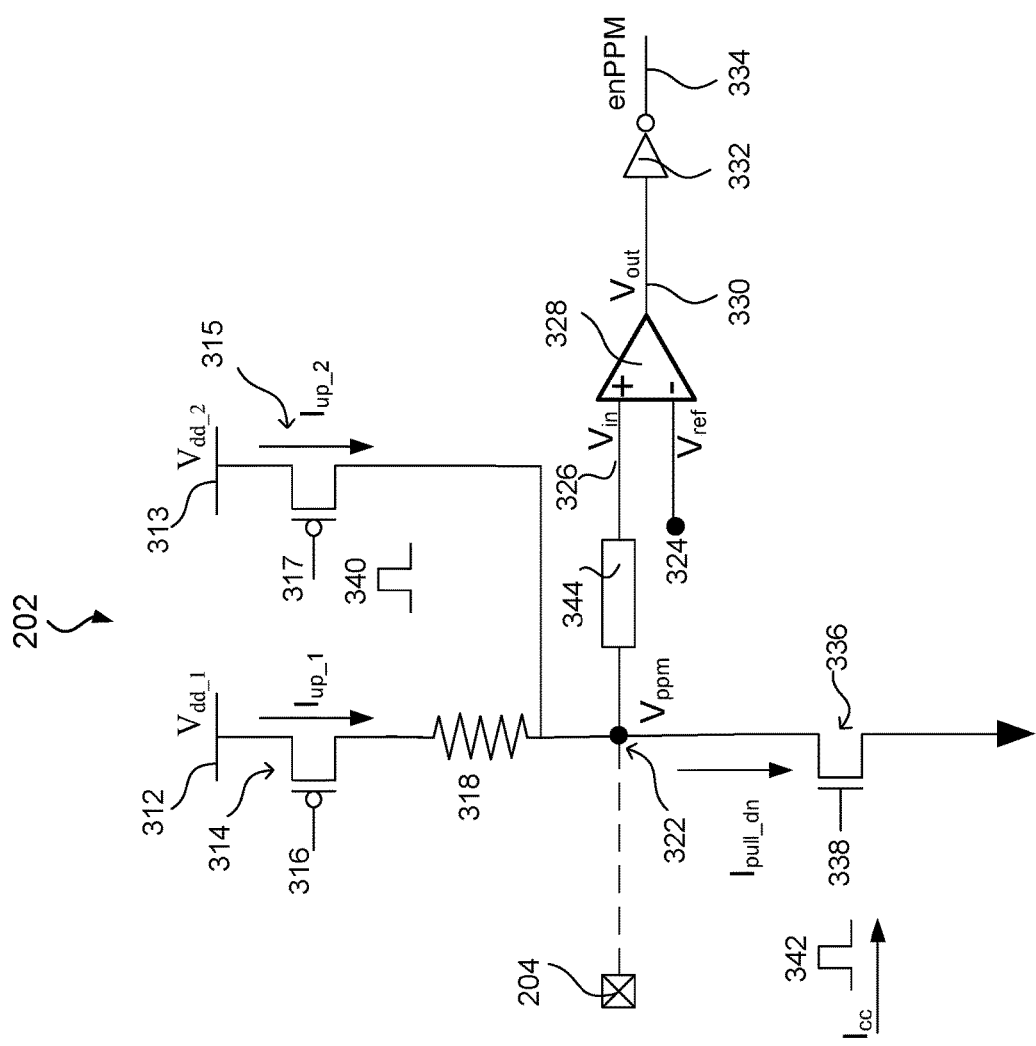
FIG. 3 illustrates a peak power management circuit, according to some embodiments of the present disclosure.

FIG. 3 illustrates an exemplary PPM circuit 202 on the NAND flash memory 100, according to some embodiments of the present disclosure. The PPM circuit 202 can include a first pull-up driver 314, where one terminal of the first pull-up driver 314 is connected to a first power source 312 with a first voltage $V_{dd\_1}$. In some embodiments, the first pull-up driver 314 can be a metal-oxide-semiconductor-field-effect-transistor (MOSFET). In some embodiments, the first pull-up driver 314 can be a p-channel MOSFET (i.e., pFET), where a source terminal of the first pull-up driver 314 can be connected to the first power source 312 and a drain terminal of the first pull-up driver 314 can be connected to a first end of a PPM resistor 318 with a resistance $R_{ppm}$.

In some embodiments, the PPM circuit 202 can also include a second pull-up driver 315, where one terminal of the second pull-up driver 315 is connected to a second power source 313 with a second voltage $V_{dd\_2}$. In some embodiments, the second pull-up driver 315 can be a metal-oxide-semiconductor-field-effect-transistor (MOSFET). In some embodiments, the second pull-up driver 315 can be a p-channel MOSFET (i.e., pFET), where a source terminal of the second pull-up driver 315 can be connected to the second power source 313 and a drain terminal of the second pull-up driver 315 can also be connected to a second end of the PPM resistor 318. In this configuration, the first pull-up driver 314 and the second pull-up driver 315 are connected in parallel.

In some embodiments, the first pull-up driver 314 can have a first current $I_{up\_1}$; and the second pull-up driver 315 can have a second current $I_{up\_2}$. Current flowing through the first pull-up driver 314 and the second pull-up driver 315 can be controlled by applying a bias on a gate terminal 316 of the first pull-up driver and/or a gate terminal 317 of the second pull-up driver 315. In one example, the first pull-up driver 314 can be kept as slightly or weakly turned on (e.g., with low trans-conductance), and thereby also referred to as the "weak pull-up driver." In some embodiments, the second pull-up driver 315 can be fully switched on (e.g., with high trans-conductance), and thereby also referred to as the "strong pull-up driver." The first current $I_{up\_1}$ can be much less than the second current $I_{up\_2}$. In some embodiments, the first current $I_{up\_1}$ can be in a range between about 100 nA to about 1 μA. In some embodiments, the second current $I_{up\_2}$ can be in a range between about 10 μA to 1 mA. In some embodiments, the first voltage $V_{dd\_1}$ and the second voltage $V_{dd\_2}$ can have the same magnitude.

In some embodiments, the PPM circuit 202 also includes a pull-down driver 336. In some embodiments, the pull-down driver 336 can be a MOSFET. In some embodiments, the pull-down driver 336 can be an n-channel MOSFET (i.e., nFET). A source terminal of the pull-down driver 336 can be grounded, and a drain terminal of the pull-down driver 336 can be connected to the second end of the PPM resistor 318 at a node 322.

In some embodiments, the second end of the PPM resistor 318, the drain terminal of the second pull-up driver 315 and the drain terminal of the pull-down driver 336 are also electrically connected to the PPM contact pad 204 at the node 322. For the PPM system 200A having two PPM circuits 202 in each PPM group 203 (as shown in FIG. 2A), the PPM contact pads 204 in the same PPM group 203 can be held to an electrical potential $V_{ppm}$ at the node 322, common to the two PPM contact pads 204 and the two PPM circuits 202, because the two PPM contact pads 204 are electrically connected through the die-to-die connection 205 (see FIG. 2A). For the PPM system 200B having two or more PPM circuits 202 in each PPM group 203 (as shown in FIG. 2B), the PPM contact pads 204 in the same PPM group 203 can also be held to the electrical potential $V_{ppm}$ at the node 322, common to all the PPM contact pads 204 and the PPM circuits 202 in the PPM system 200B, because all the PPM contact pads 204 are electrically connected through the die-to-die connections 205 (see FIG. 2B).

In some embodiments, the PPM circuit 202 can also include a comparator 328, with a first input terminal 324 at a reference voltage $V_{ref}$ and a second input terminal 326 connected to the node 322 (or the PPM contact pad 204). The comparator 328 can be an operational amplifier used for comparing an input voltage $V_{in}$ at the second input terminal 326 with the reference voltage $V_{ref}$ at the first input terminal 324, where an output voltage $V_{out}$ at an output terminal 330 can indicate whether the input voltage $V_{in}$ is above or below the reference voltage $V_{ref}$. For example, the output voltage $V_{out}$ can be a positive voltage when the input voltage $V_{in}$ is larger than the reference voltage $V_{ref}$. On the other hand, the output voltage $V_{out}$ can be a negative voltage when the input voltage $V_{in}$ is smaller than the reference voltage $V_{ref}$.

In some embodiments, the PPM circuit 202 can further include an inverter 332 with an input terminal connected to the output terminal 330 of the comparator 328. The inverter 332 can invert an input signal. For example, when the output voltage $V_{out}$ of the comparator 328 is a positive voltage, a PPM enablement signal enPPM generated by the inverter 332 at an output terminal 334 can be zero, i.e., the PPM enablement signal enPPM=0. On the other hand, when the output voltage $V_{out}$ of the comparator 328 is a negative voltage, the PPM enablement signal enPPM=1. In the other words, when the electrical potential $V_{ppm}$ at the node 322 is larger (or higher) than the reference voltage $V_{ref}$ (i.e., $V_{ppm}>V_{ref}$), the PPM enablement signal enPPM=0. When the electrical potential $V_{ppm}$ at the node 322 is smaller (or lower) than the reference voltage $V_{ref}$ (i.e., $V_{ppm}<V_{ref}$), the PPM enablement signal enPPM=1.

In some embodiments, there can be an optional RC filter 344 connected between the node 322 and the second input terminal 326 of the comparator 328. The RC filter 344 can be used to filter out unwanted signals within a certain frequency range.

As discussed previously, the PPM contact pads 204 in the same PPM group 203 can be electrically connected for the PPM system 200A (in FIG. 2A) and the PPM system 200B (in FIG. 2B), i.e., the PPM contact pads 204 of the same PPM group 203 can be held at the electric potential $V_{ppm}$, common to all the PPM contact pads 204 in the same PPM group 203. Therefore, each PPM group 203 only needs one comparator 328 that is electrically connected to one of the PPM contact pads 204 at the node 322. And the PPM enablement signal enPPM indicates the electrical potential $V_{ppm}$ for the two or more memory dies in the PPM group 203.

Referring to FIG. 3, during operation, a first control signal 340 can be sent to the gate terminal 317 of the second pull-up driver 315 to switch the second pull-up driver 315 on or off. For example, if the first control signal 340 has a voltage less than a threshold voltage of the second pull-up driver 315, the second pull-up driver 315 can be switched on, and the second current $I_{up\_2}$ can thereby flow through the second pull-up driver 315. If the first control signal 340 has a voltage higher than the threshold voltage of the second pull-up driver 315, the second pull-up driver 315 can be switched off.

The current flowing through the pull-down driver 336 is also referred to as a pull-down current $I_{pull\_dn}$. In the configuration of FIG. 3, the pull-down current $I_{pull\_dn}$ can be the sum of the first current $I_{up\_1}$ and the second current $I_{up\_2}$. When the second pull-up driver 315 is switched on, the pull-down current $I_{pull\_dn}$ is dominated by the second current $I_{up\_2}$ because the second current $I_{up\_2}$ flowing through the "strong pull-up driver" is much larger than the first current $I_{up\_1}$ flowing through the "weak pull-up driver," as discussed previously. When the second pull-up driver 315 is switched off, only the first current $I_{up\_1}$ flows through the PPM resistor 318 and the node 322 to the pull-down driver 336.

When a second control signal 342 is sent to a gate terminal 338 of the pull-down driver 336, the pull-down driver 336 can be switched on or off. For example, if the second control signal 342 has a voltage higher than a threshold voltage of the pull-down driver 336, the pull-down driver 336 can be switched on, and a conductive path can be formed from the node 322 to the ground. If the second control signal 342 has a voltage less than the threshold voltage of the pull-down driver 336, the pull-down driver 336 can be switched off.

In some embodiments, the pull-down driver 336 can be operated as a current controller. In this example, when the pull-down driver 336 is switched on, the magnitude of the current flowing through the pull-down driver 336 from the node 322 to the ground (i.e., the pull-down current $I_{pull\_dn}$) depends on the second control signal 342. When the pull-down driver 336 is an nFET, as shown in FIG. 3, the pull-down current $I_{pull\_dn}$ can be determined by the voltage level of the second control signal 342 and the trans-conductance of the pull-down driver 336. According to some embodiments of the present disclosure, a current profile $I_{cc}$ of a memory die (e.g., the NAND flash memory 100-1) can correspond to the voltage level of the second control signal 342, and thereby correspond to the pull-down current $I_{pull\_dn}$. Therefore, the pull-down current $I_{pull\_dn}$ can function as a current mirror of the current profile $I_{cc}$ of the memory die.

In some embodiments, the pull-down current $I_{pull\_dn}$ can be proportional to a current level of the current profile $I_{cc}$. The pull-down current $I_{pull\_dn}$ can be scaled down proportionally from the current profile $I_{cc}$. For example, if the memory die is operating with 200 mA of current, the pull-down current $I_{pull\_dn}$ of the PPM circuit 202 can be 200 μA. Therefore, memory operations and corresponding current can be regulated for each memory die through the pull-down current $I_{pull\_dn}$. Furthermore, through the die-to-die connections at the PPM contact pads, peak power operations in the PPM group 203 can be coordinated between two or more memory dies as shown in FIGS. 2A and 2B.

For example, when the PPM circuit 202 is at a reset state, the second pull-up driver 315 can be switched off and no second current $I_{up\_2}$ flows through the node 322. In the meantime, the first pull-up driver 314 can be kept on by default, and the pull-down driver 336 can be switched off. Accordingly, the electric potential $V_{ppm}$ at node 322 (or at PPM contact pad 204) can be held at a first voltage level, higher than the reference voltage $V_{ref}$, via a conductive path through the PPM resistor 318 and the first pull-up driver 314 to the first power source 312.

In some embodiments, at the reset state, the pull-down driver 336 can also be kept on slightly or weakly (e.g., with low trans-conductance) such that the electrical potential of $V_{ppm}$ can be held close to the first voltage level, still higher than the reference voltage $V_{ref}$. In this example, the pull-down current $I_{pull\_dn}$ can be determined by the first current $I_{up\_1}$ in the absence of the second current $I_{up\_2}$. This low level of pull-down current $I_{pull\_dn}$ corresponds to a low level current $I_L$ running on the memory die. The memory die can perform operations that consume the low level current $I_L$.

In some embodiments, the pull-down driver 336 can be fully switched on (e.g., with high trans-conductance). In this example, the electric potential $V_{ppm}$ at node 322 (or PPM contact pad 204) can be held at a second voltage level, lower than the reference voltage $V_{ref}$, via another conductive path through the pull-down driver 336 to the ground.

In some embodiments, a positive pulse in the electric potential $V_{ppm}$ can be formed by switching on the second pull-up driver 315 and subsequently (e.g., about 1 μs later), switching on the pull-down driver 336.

As discussed previously, when the second pull-up driver 315 is switched on, the pull-down current $I_{pull\_dn}$ can be the sum of the first current $I_{up\_1}$ and the second current $I_{up\_2}$. This high level of pull-down current $I_{pull\_dn}$ corresponds to a high level current $I_H$ running on the memory die. The memory die can perform a peak power operation (PPO) that consume the high level current $I_H$.

Figure 4:
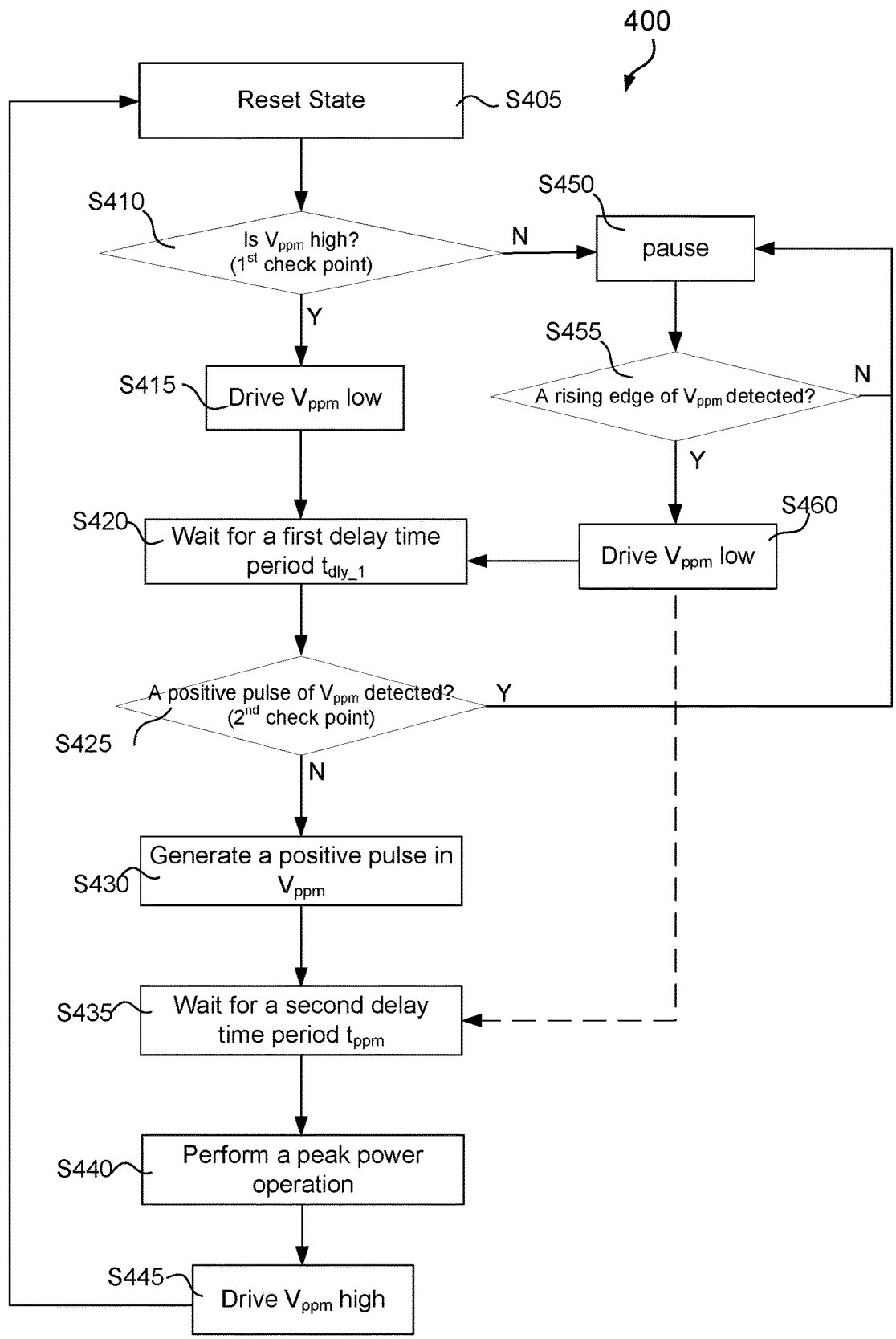
FIG. 4 illustrates a peak power check routine, according to some embodiments of the present disclosure.

FIG. 4 illustrates a peak power check routine 400 associated with the peak power management system 200A in FIG. 2A or 200B in FIG. 2B using the PPM circuit 202 in FIG. 3, according to some embodiments of the present disclosure. It should be understood that the peak power check (PPC) routine 400 is not exhaustive and that other operation steps can be performed as well before, after, or between any of the illustrated operation steps. In some embodiments, some operation steps of the PPC routine 400 can be omitted or other operation steps can be included, which are not described here for simplicity. In some embodiments, operation steps of the PPC routine 400 can be performed in a different order and/or vary.

The PPC routine 400 provides an exemplary method of managing peak power operations in the PPM group 203 with two or more memory dies, where each memory die includes at least one PPM circuit 202. The example below is shown for a particular memory die, where its peak power operation is not performed simultaneously with another peak power operation on another memory die in the same PPM group 203. As such, the total power (or current) consumed by the PPM group 203 can be regulated and controlled to below a predetermined value.

As shown in FIG. 4, the PPC routine 400 starts at operation step S405, where the PPM circuit 202 on the particular memory die is at the reset state. As discussed previously with reference to FIG. 3, at the reset state, the pull-down driver 336 of the PPM circuit 202 can be switched off.

When the particular memory die is about to perform the peak power operation, the PPC routine 400 can be launched for the particular memory die and can proceed to operation step S410, a first check point in the PPC routine 400. At operation step S410, the electric potential $V_{ppm}$ of the PPM contact pad 204 is first detected and then compared with the reference voltage $V_{ref}$.

If it is determined that the electric potential $V_{ppm}$ is larger or higher than the reference voltage $V_{ref}$, i.e., at the first voltage level (also referred to as the "high" level), the PPC routine can proceed to operation step S415. As discussed previously, the electric potential $V_{ppm}$ is common to all the PPM contact pads 204 of the PPM circuit 202 in the same PPM group 203. When the electric potential $V_{ppm}$ is at the first voltage level, it indicates that none of the memory die in the same PPM group 203 is performing the peak power operation. As such, the particular memory die can continue its PPC routine 400.

To prevent other memory dies in the same PPM group 203 performing the peak power operations and to reserve the power/current budget for the particular memory die, at operation step S415, the electric potential $V_{ppm}$ of the PPM contact pad 204 can be driven to the second voltage level that is smaller or lower than the reference voltage $V_R$. The electric potential $V_{ppm}$ can be set at the second voltage level (also referred to as the "low" level) by switching on the pull-down driver 336 of the PPM circuit 202 on the particular memory die.

The PPC routine 400 then proceeds to operation step S420, where the particular memory die is enabled to wait for a first delay time period $t_{dly\_1}$. In some embodiments, the first delay time period $t_{dly\_1}$ is unique to the particular memory die in the PPM group 203. In the other words, each memory die in the PPM group 203 has a different first delay time period $t_{dly\_1}$. For example, the NAND flash memory 100-1 and the NAND flash memory 100-2 in FIG. 2A have the first delay time periods $t_{dly\_1}$ with different values. In case that any other memory die and the particular memory die launch the PPC routines 400 and start the first check point (i.e., operation step S410) at the same time, due to different first delay time periods $t_{dly\_1}$, the PPC routines 400 for the other memory die and the particular memory die do not proceed to operation step S425 (i.e., a second check point) simultaneously. As such, memory dies in the same PPM group 203 can be de-synchronized when they perform PPOs.

The PPC routine 400 then proceeds to operation step S425, the second check point, where it is determined whether there is a pausing signal in the electric potential $V_{ppm}$ of the PPM contact pad 204. In some embodiments, the pausing signal includes a positive pulse of the electric potential $V_{ppm}$.

If no pausing signal is detected, the PPC routine 400 continues to operation step S430, where the pausing signal can be generated. In the example that the pausing signal includes the positive pulse in the electric potential $V_{ppm}$, the pausing signal can be generated by switching on the second pull-up driver 315 and then (e.g., about 1 μs later) switching on the pull-down driver 336. The pausing signal is generated such that other PPC routines for other memory dies in the PPM group 203 can be paused according to the pausing signal.

At operation step S435, the PPC routine 400 waits for a second delay time period $t_{ppm}$. In some embodiments, the second delay time period $t_{ppm}$ can be different for the two or more memory dies in the same PPM group 203. Different from the first delay time period $t_{dly\_1}$, in some embodiments, the second delay time period $t_{ppm}$ can be the same for the two or more memory dies in the same PPM group 203. The second delay time period $t_{ppm}$ can be any suitable time period predetermined by the NAND storage system 10 to include communication delays between the PPC routine 400 and the PPO. In some embodiments, the second delay time period $t_{ppm}$ depends on firmware design for the NAND storage system 10.

When the PPC routine 400 starts operation step S440, the particular memory die can start to perform the PPO, where the high current level $I_H$ on the particular memory die can correspond to the pull-down current $I_{pull\_dn}$ flowing through the pull-down driver 336 of the PPM circuit 202, which is a sum of the first current $I_{up\_1}$ and the second current $I_{up\_2}$.

After the particular memory die completes the PPO, the PPC routine 400 proceeds to operation step S445, where a resuming signal can be generated in the electric potential $V_{ppm}$ of the PPM contact pad 204. The resuming signal can be used for other memory dies to resume their PPC routines that are in pause. In some embodiments, the resuming signal can be generated by driving the electric potential $V_{ppm}$ to the first voltage level (e.g., from the low level to the high level). For example, the second pull-up driver 315 of the PPM circuit 202 on the particular memory die can be switched off. The pull-down driver 336 can also be switched off. In some embodiments, the pull-down driver 336 can be kept on slightly or weakly such that the pull-down current $I_{pull\_dn}$ is about the same as the first current $I_{up\_1}$, which corresponds to the low current level $I_L$ used by operations on the memory die.

If at operation step S410 the electric potential $V_{ppm}$ is determined to be smaller or lower than the reference voltage $V_{ref}$, i.e., at the second voltage level, it indicates that at least one of the other memory dies of the PPM group 203 is performing PPO or is about to perform PPO and has driven the electric potential $V_{ppm}$ from the high level to the low level. Then the PPC routine 400 for the particular memory die is paused at operation step S450.

Similarly, if the pausing signal is detected at operation step S425, the PPC routine 400 for the particular memory die also pauses at operation step S450. In some embodiments, the PPC routine 400 constantly checks whether there is the pausing signal while waiting at operation step S420 during the first delay time period $t_{dly\_1}$. In this example, the pausing signal can trigger the PPC routine 400 to pause at operation step S450 as soon as the pausing signal is detected during the first delay time period $t_{dly\_1}$ at operation step S420.

When the PPC routine 400 for the particular memory die is paused at operation step S450, it constantly checks if there is the resuming signal in the electric potential $V_{ppm}$ of the PPM contact pad 204. In the example that the resuming signal is generated by driving the electric potential $V_{ppm}$ to the first voltage level, i.e., from the low level to the high level, a rising edge of the electric potential $V_{ppm}$ can be used to trigger the PPC routine 400, which is paused at operation step S450, to resume. If the resuming signal is detected at operation step S455, the PPC routine 400 continues to operation step S460, where the electric potential $V_{ppm}$ is driven to the second voltage level (i.e., the low level) to reserve the power/current resource for the particular memory die. The PPC routine 400 remains paused at operation step S450 if there is no resuming signal detected.

Next, the PPC routine 400 proceeds to operation step S420. In some embodiments, the PPC routine 400 can proceed to operation step S435, when there are only two memory dies in one PPM group. In this example, waiting for the first delay time period $t_{dly\_1}$ can be skipped for the particular memory die after resuming the PPC routine 400 because the other memory die has completed PPO. Thus, there is no coincidence that the two memory dies perform PPO simultaneously after pause-resume.

Figure 5:
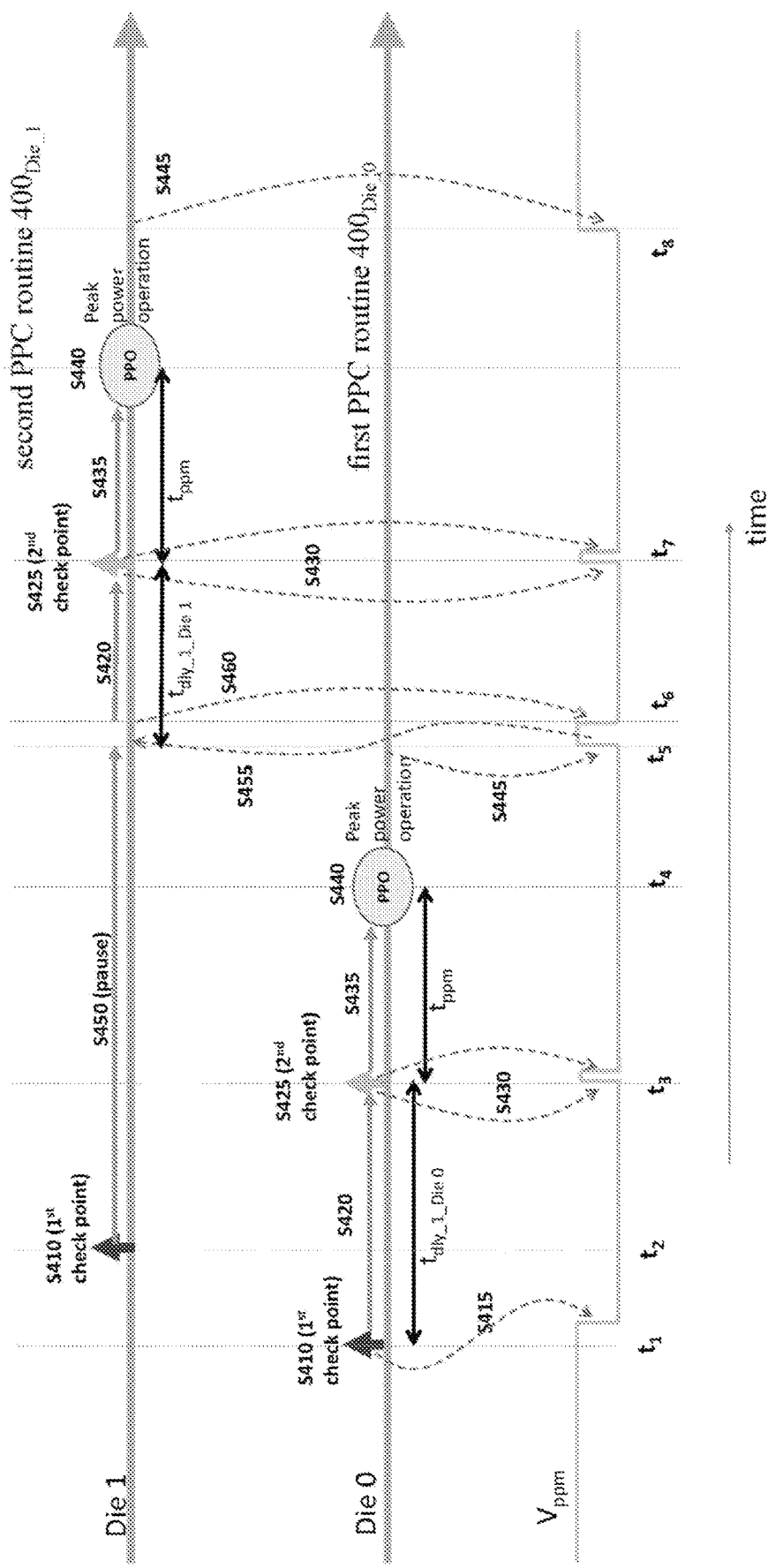
FIGS. 5-7 illustrate implementations of the peak power check routine shown in FIG. 4 on two memory dies, according to some embodiments of the present disclosure.
Figure 6:
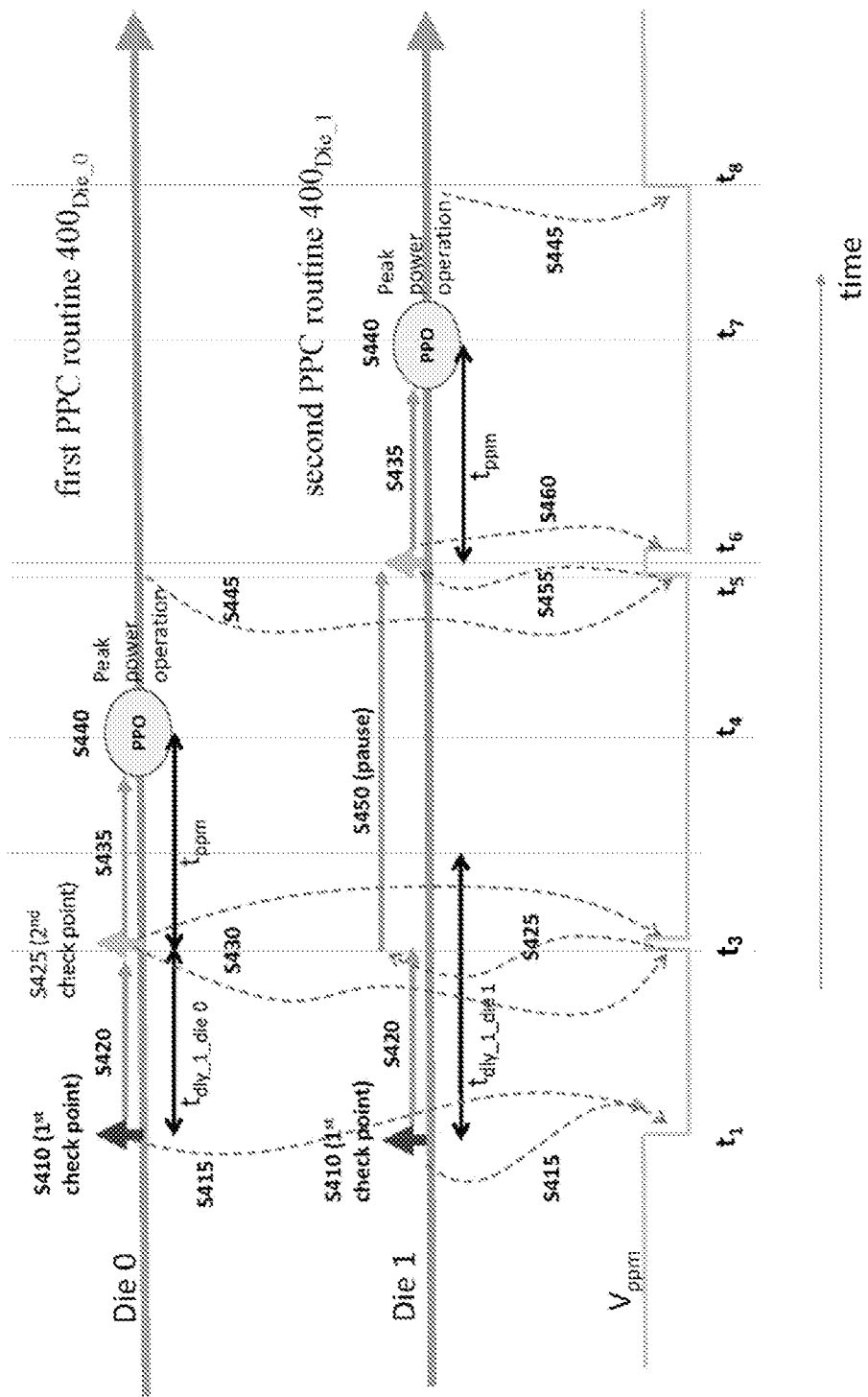
Figure 7:
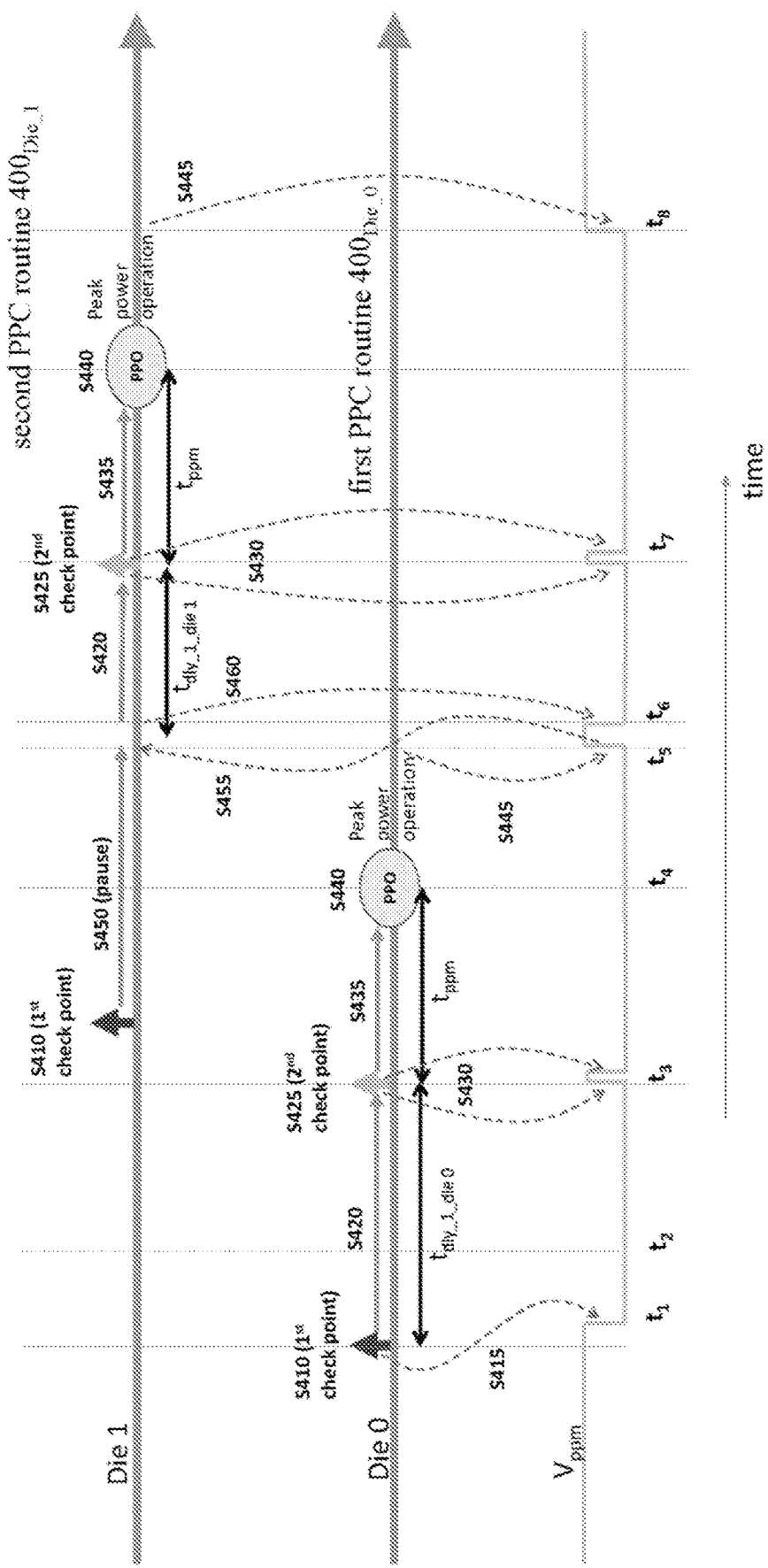

FIGS. 5-7 illustrate three exemplary implementations of the PPC routine 400 for the PPM system 200A in FIG. 2A, where each PPM group 203 includes two memory dies, e.g., "Die 0" (also referred to as a first NAND memory die) and "Die 1" (also referred to as a second NAND memory die). Die 0 and Die 1 can be similar to the NAND flash memory 100 shown in FIGS. 1-2.

In the example shown in FIG. 5, the two memory dies, Die 0 and Die 1, are all at the reset state at the beginning of the time sequence. Die 0 receives a command signal to perform a first PPO before Die 1 receives its command signal to perform a second PPO. Therefore, a first PPC routine $400_{Die\_0}$ is launched first for Die 0. At time $t_1$ (i.e., a first timing), the first PPC routine $400_{Die\_0}$ for Die 0 starts operation step S410 to detect the electric potential $V_{ppm}$ of the PPM contact pad 204 of the PPM circuit 202 on Die 0. Because neither Die 0 or Die 1 is performing the first PPO or the second PPO, the electric potential $V_{ppm}$ is held at the high level (the first voltage level) with the pull-down current $I_{pull\_dn}$ of a magnitude negligible or about the first current $I_{up\_1}$ on both Die 0 and Die 1. Namely, both Die 0 and Die 1 are performing operations with the low current level $I_L$.

After determining the electric potential $V_{ppm}$ is at the high level at time $t_1$, the electric potential $V_{ppm}$ is driven to the low level (i.e., the second voltage level) according to operation step S415 of the first PPC routine $400_{Die\_0}$ for Die 0.

When Die 1 receives its command signal to perform the PPO, a second PPC routine $400_{Die\_1}$ can be launched for Die 1 and proceeds to operation step S410 at time $t_2$ (i.e., a third timing). In this example, the time $t_2$ is later than the time $t_1$. Since the electric potential $V_{ppm}$ has been driven to the low level according to the first PPC routine $400_{Die\_0}$ for Die 0, the second PPC routine $400_{Die\_1}$ for Die 1 is paused at operation step S450.

After driving the electric potential $V_{ppm}$ to the low level, the first PPC routine $400_{Die\_0}$ enables Die 0 to wait for the first delay time period $t_{dly\_1\_Die\_0}$ a at operation step S420. Because no pausing signal (e.g., the positive pulse of the electric potential $V_{ppm}$) is detected at operation step S425, the pausing signal is generated according to operation step S430 of the first PPC routine $400_{Die\_0}$ for Die 0 at time $t_3$ (i.e., a second timing). After waiting for the second delay time period $t_{ppm}$ (operation step S435), Die 0 can start the first PPO at time $t_4$ according to operation step S440 of the first PPC routine $400_{Die\_0}$. At time $t_5$ ("a fifth timing), Die 0 completes the first PPO and the resuming signal is generated according to operation step S445 of the first PPC routine $400_{Die\_0}$. In this example, the resuming signal is generated by driving the electric potential $V_{ppm}$ to the high level.

Between time $t_2$ and time $t_5$, the second PPC routine $400_{Die\_1}$ for Die 1 is paused at operation step S450. When the resuming signal is detected in the electric potential $V_{ppm}$ at time $t_5$, the second PPC routine $400_{Die\_1}$ for Die 1 resumes. In this example, the rising edge of the electric potential $V_{ppm}$ at time $t_5$ can be used to trigger the second PPC routine $400_{Die\_1}$ to resume. The electric potential $V_{ppm}$ is subsequently driven to the low level at time $t_6$ ("a sixth timing") according to operation step S460 of the second PPC routine $400_{Die\_1}$. In FIG. 5, a falling edge of the electric potential $V_{ppm}$ is thereby generated. It is noted that a duration between the rising edge generated according to the first PPC routine $400_{Die\_0}$ for Die 0 at time $t_5$ and the falling edge generated according to the second PPC routine $400_{Die\_1}$ for Die 1 at time $t_6$ is longer than a pulse width of the positive pulse generated according to the first PPC routine $400_{Die\_0}$ for Die 0 at time $t_3$. By driving the electric potential $V_{ppm}$ to the low level, the power/current resource can be reserved for Die 1. For example, in case another PPO is requested for Die 0, the new PPC routine will be paused after the first check point (at operation step S410). As such, the second PPC routine $400_{Die\_1}$ for Die 1, which has been paused at operation step S450, can finish without further delay.

Next, the second PPC routine $400_{Die\_1}$ for Die 1 proceeds to operation step S420, where Die 1 waits for the first delay time period $t_{dly\_1\_Die\ 1}$. At operation step S425 of the second PPC routine $400_{Die\_1}$, it is checked whether there is the pausing signal in the electric potential $V_{ppm}$. The pausing signal (e.g., the positive pulse of the electric potential $V_{ppm}$) is generated at time $t_7$ (also referred to as a fourth timing) when it is not detected. After waiting for the second delay time period $t_{ppm}$ at operation step S435, Die 1 starts to perform the second PPO at operation step S440 according to second PPC routine $400_{Die\_1}$. At time $t_8$ ("an eight timing"), Die 1 completes the second PPO and the resuming signal is generated by driving the electric potential $V_{ppm}$ to the high level at operation step S445.

As such, Die 0 and Die 1 complete the first PPO and the second PPO, respectively. By using the first PPC routine $400_{Die\_0}$ and the second PPC routine $400_{Die\_1}$, two memory dies (e.g., Die 0 and Die 1) in the same PPM group 203 (see FIG. 2) can coordinate their PPOs through the PPM circuits 202. By regulating the electric potential $V_{ppm}$ shared by the PPM contact pads 204, PPOs can be de-synchronized for the two memory dies.

FIG. 6 illustrates another exemplary implementation of the PPC routine 400, according to some embodiments of the present disclosure. In FIG. 6, Die 0 (i.e., the first NAND memory die) and Die 1 (i.e., the second NAND memory die) receive the command signals for the first PPO and the second PPO simultaneously from the NAND storage system 10. Therefore, the first PPC routine $400_{Die\_0}$ and the second PPC routine $400_{Die\_1}$ arrive at the first check point (operation step S410) at the same time. When the electric potential $V_{ppm}$ is determined to be at the high level (i.e., the first voltage level), the electric potential $V_{ppm}$ is driven to the low level (i.e., the second voltage level) at time $t_1$ (the first timing) at operation step S415. Both Die 0 and Die 1 then wait for the respective first delay time period $t_{dly\_1\_Die\ 0}$ and $t_{dly\_1\_Die\ 1}$ at operation step S420 according to the respective first PPC routine $400_{Die\_0}$ and the second PPC routine $400_{Die\_1}$.

In the example in FIG. 6, the first delay time period $t_{dly\_1\_Die\ 0}$ of Die 0 is shorter than the first delay time period $t_{dly\_1\_Die\ 1}$ of Die 1. As such, the first PPC routine $400_{Die\_0}$ for Die 0 completes operation step S420 before the second PPC routine $400_{Die\_1}$ for Die 1. When it is determined that there is no pausing signal (e.g., the positive pulse) in the electric potential $V_{ppm}$ at the second check point according to operation step S425 of the first PPC routine $400_{Die\_0}$ for Die 0, the pausing signal is subsequently generated at time $t_3$ (i.e., the second timing) at operation step S430.

While Die 1 is waiting during the first delay time period $t_{dly\_1\_Die\ 1}$ at operation step S420, the pausing signal is detected in the electric potential $V_{ppm}$ according to operation step S425 of the second PPC routine $400_{Die\_1}$. In this example, the pausing signal triggers the second PPC routine $400_{Die\_1}$ for Die 1 to pause at operation step S450 after the pausing signal is detected, before the first delay time period $t_{dly\_1\_Die\ 1}$ can be completed at time $t_3$ (as shown in FIG. 6).

While the second PPC routine $400_{Die\_1}$ for Die 1 is paused, the first PPC routine $400_{Die\_0}$ for Die 0 continues to operation step S435, i.e., waiting for the second delay time period $t_{ppm}$. Die 0 then starts the first PPO at operation step S440 at time $t_4$. When Die 0 completes the first PPO at time $t_5$, the resuming signal is generated according to operation step S445 of the first PPC routine $400_{Die\_0}$ for Die 0. In this example, the electric potential $V_{ppm}$ is driven to the high level.

When the resuming signal is detected according to operation step S455 of the second PPC routine $400_{Die\_1}$ for Die 1, for example, trigged by the rising edge of the electric potential $V_{ppm}$, the second PPC routine $400_{Die\_1}$ resumes and proceeds to operation step S460 by driving the electric potential $V_{ppm}$ to the low level at time $t_6$. Next, the second PPC routine $400_{Die\_1}$ proceeds directly to operation step S435 because there are only two memory dies in the same PPM group 203 and Die 0 has completed the first PPO. After waiting for the second delay time period $t_{ppm}$, at time $t_7$, Die 1 starts the second PPO at operation step S440. When Die 1 completes the second PPO, the resuming signal is generated at time $t_8$ according to operation step S445 of the second PPC routine $400_{Die\_1}$. Here, the electric potential $V_{ppm}$ is driven to the high level again.

FIG. 7 illustrates yet another exemplary implementation of the PPC routine 400 shown in FIG. 4, according to some embodiments of the present disclosure. In FIG. 7, Die 1 (i.e., the second NAND memory die) receives a command signal for the second PPO after Die 0 (i.e., the first NAND memory die) has already completed the second check point according to operation step S425 of the first PPC routine $400_{Die\_0}$ for Die 0.

In this example, the first PPC routine $400_{Die\_0}$ for Die 0 starts at time $t_1$ (i.e., the first timing) at operation step S410, and it is determined that the electric potential $V_{ppm}$ is held at the high level (i.e., the first voltage level). Then, the electric potential $V_{ppm}$ is then driven to the low level (i.e., the second voltage level) according to operation step S415. Subsequently, Die 0 waits for the first delay time period $t_{dly\_1\_Die\ 0}$ at operation step S420. Because no pausing signal (e.g., the positive pulse) is detected in the electric potential $V_{ppm}$ according to operation step S425, the pausing signal is generated at time $t_3$ (i.e, the second timing) at operation step S430. After the second delay time period $t_{ppm}$ (operation step S435), Die 0 starts the first PPO at time $t_4$ (operation step S440). At time $t_5$, Die 0 completes the first PPO and the resuming signal is generated (operation step S445). For example, the electric potential $V_{ppm}$ can be driven to the high level.

In the example in FIG. 7, when Die 1 receives a command signal to perform the second PPO after time $t_3$, the second PPC routine $400_{Die\_1}$ for Die 1 is started and proceeds to operation step S410. Since the electric potential $V_{ppm}$ has been driven to the low level according to the first PPC routine $400_{Die\_0}$ for Die 0 at time $t_3$, Die 1 pauses the second PPC routine $400_{Die\_1}$ at operation step S450.

At time $t_5$, when the resuming signal is detected according to operation step S455, the second PPC routine $400_{Die\_1}$ for Die 1 resumes at time $t_6$ (operation step S460), where the electric potential $V_{ppm}$ can be driven to the low level. Here, the resuming of the second PPC routine $400_{Die\_1}$ for Die 1 can be triggered at time $t_5$ by a rising edge of the electric potential $V_{ppm}$. And a falling edge of the electric potential $V_{ppm}$ at time $t_6$ results from the electric potential $V_{ppm}$ driven to the low level.

Then, the second PPC routine $400_{Die\_1}$ for Die 1 proceeds to operation step S420, where Die 1 waits for the first delay time period $t_{dly\_1\_Die\_1}$. Die 1 then checks whether there is the pausing signal in the electric potential $V_{ppm}$ at operation step S425. The pausing signal (i.e., the positive pulse of the electric potential $V_{ppm}$) is then generated at time $t_7$ (i.e., the fourth timing) when it is not detected. After waiting for the second delay time period $t_{ppm}$ (operation step S435), Die 1 starts the second PPO at operation step S440. At time $t_5$, Die 1 completes the second PPO and the resuming signal is generated according to operation step S445 of the second PPC routine $400_{Die\_1}$, for example, by driving the electric potential $V_{ppm}$ to the high level. As such, Die 0 and Die 1 complete the first PPO and the second PPO sequentially.

Figure 8:
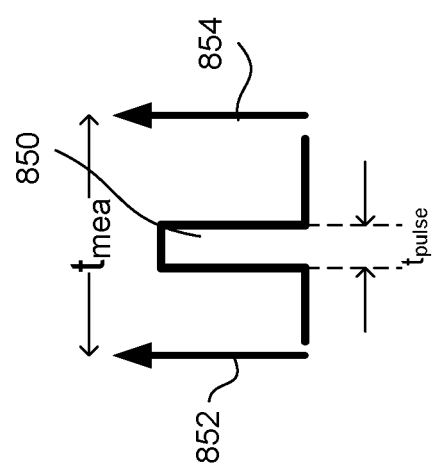
FIG. 8 illustrates a measurement scheme for a pausing signal, according to some embodiments of the present disclosure.

FIG. 8 illustrates a measurement scheme for a pulse, according to some embodiments of the present disclosure. As an example, a pulse 850 has a pulse width $t_{pulse}$. The pulse width $t_{pulse}$ can be a predetermined value, for example, in a range between about 0.1 μS and 10 μS. The pulse 850 can be the positive pulse of the electrical potential $V_{ppm}$ described with respect to FIGS. 4-7 and 9-10.

To determine the pulse 850, two measurements can be performed, including a first probing 852 and a second probing 854. The first probing 852 and the second probing 854 can be separated with a measurement time period $t_{mea}$. The measurement time period $t_{mea}$ can be longer than the pulse width $t_{pulse}$ of the pulse 850. For example, the measurement time period $t_{mea}$ can be about 20 μS.

Using the first probing 852 and the second probing 854, the pulse 850 can be determine when there is a change in the electric potential $V_{ppm}$ and both the first probing 852 and the second probing 854 detect the second voltage level (i.e., the low level) and return a value "0," for example. In the PPC routine 400 (see FIG. 4), at operation step S425, if the pausing signal (e.g, the positive pulse) of the electric potential $V_{ppm}$ is detected when there is a change in the electric potential $V_{ppm}$ and both the first probing 852 and the second probing 854 detect the second voltage level and return the value "0," the PPC routine 400 pauses at operation step S450.

On the other hand, if both the first probing 852 and the second probing 854 detect the first voltage level (i.e., the high level) and return a value "1," e.g., at operation step 410, the electric potential $V_{ppm}$ can be determined to be held at the high level and the PPC routine 400 for the memory die can continue to operation steps S415 and S420. If the first probing 852 and the second probing 854 obtain different results, e.g., "0" and "1," then the operation step 410 is repeated until both the first probing 852 and the second probing 854 measure a high potential and return the value "1."

When the first probing 852 detects the low level (returning "0") and the second probing 854 detects the high level (return "1"), it is indicated that the rising edge of electric potential $V_{ppm}$ (instead of the positive pulse) is detected.

Figure 9:
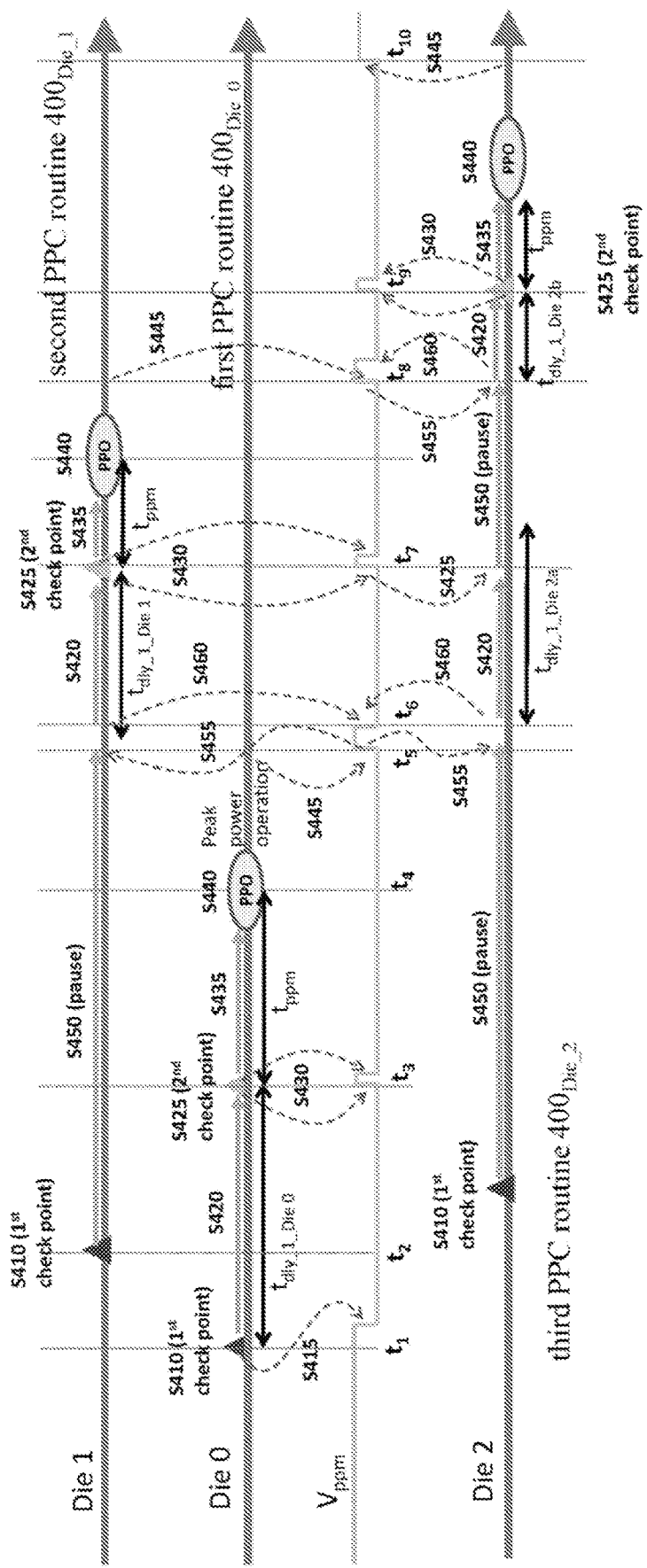
FIGS. 9-10 illustrate implementations of the peak power check routine shown in FIG. 4 on three memory dies, according to some embodiments of the present disclosure.
Figure 10:
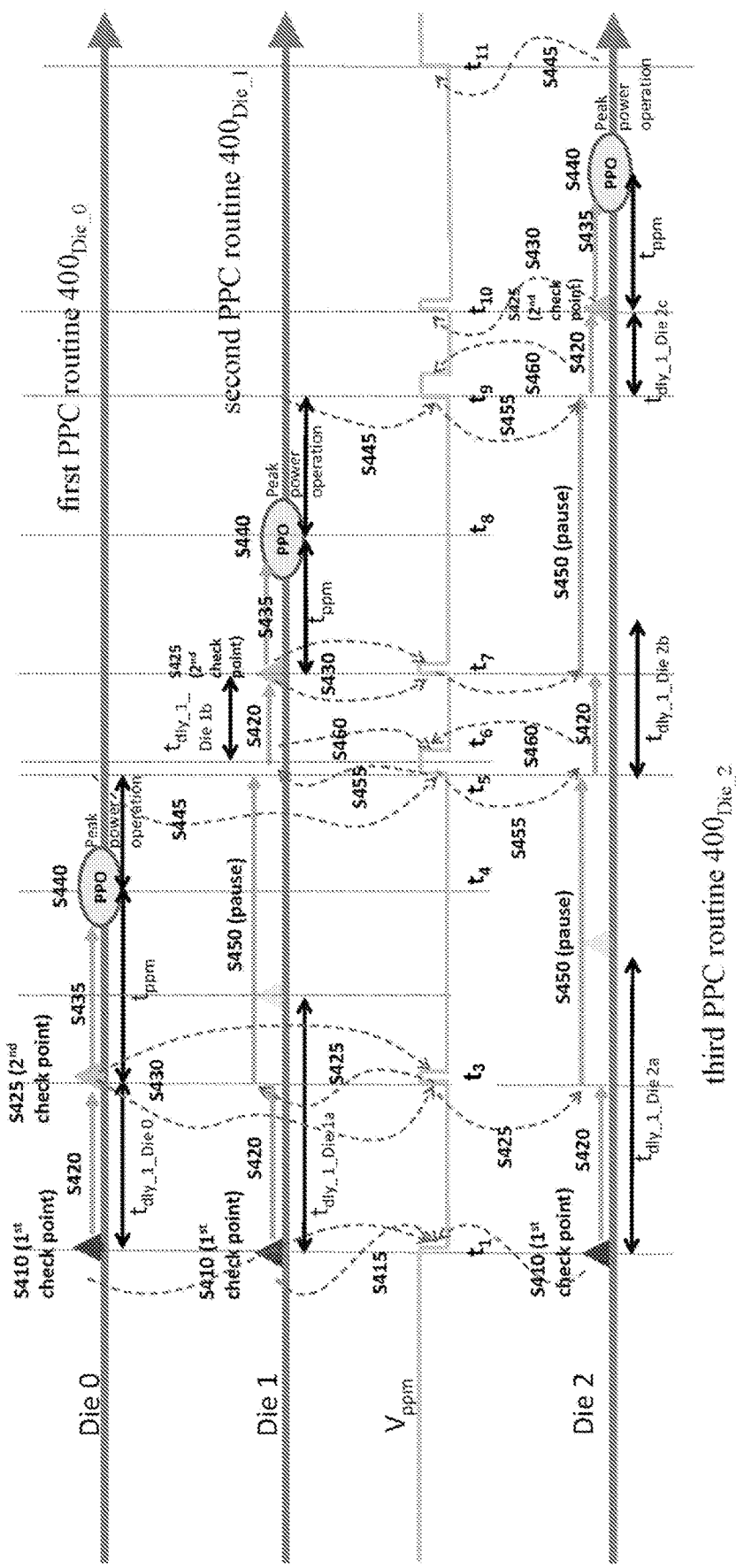

FIGS. 9-10 illustrate two exemplary implementations of the PPC routine 400 in the PPM system 200B in FIG. 2B, where each PPM group 203 includes three memory dies (e.g., "Die 0," "Die 1," and "Die 2"). Die 0 is also referred to as the first NAND memory die. Die 1 is also referred to as the second NAND memory die. Die 2 is also referred to as a third NAND memory die.

In the example shown in FIG. 9, the three memory dies, Die 0, Die 1 and Die 2 of the same PPM group 203 are all at the reset state at the beginning of the time sequence. Die 0 receives a command signal to perform the first PPO before Die 1 or Die 2. The first PPC routine $400_{Die\_0}$ for Die 0 starts first and proceeds to operation step S410 at time $t_1$ (the first timing). Because none of the memory dies is performing PPO, the electric potential $V_{ppm}$ is held at the first voltage level (e.g., the high level). As discussed previously, when the electric potential $V_{ppm}$ is held at the high level, the pull-down current $I_{pull\_dn}$ has a magnitude negligible or about the first current $I_{up\_1}$. Namely, all the memory dies (e.g., Die 0, Die 1, and Die 2) in the PPM group 203 are performing operations with the low current level $I_L$. After determining the electric potential $V_{ppm}$ is held at the first voltage level at time $t_1$ at operation step S410, the electric potential $V_{ppm}$ is driven to the second voltage level lower than the first voltage level (i.e., the low level) at operation step S415 according to the first PPC routine $400_{Die\_0}$ for Die 0.

When Die 1 receives its command signal to perform the second PPO, Die 1 starts the operation step S410 of the second PPC routine $400_{Die\_1}$ at time $t_2$ (the third timing). Here, time $t_2$ is later than the time $t_1$. Since the electric potential $V_{ppm}$ has been driven to the low level by Die 0, the second PPC routine $400_{Die\_1}$ for Die 1 pauses at operation step S450. Similarly, when Die 2 receives its command signal to perform a third PPO, the electric potential $V_{ppm}$ is detected to be held at the low level according to operation step S410 of a third PPC routine $400_{Die\_2}$, and subsequently the third PPC routine $400_{Die\_2}$ for Die 2 is also paused according to operation step S450.

After setting the electric potential $V_{ppm}$ to the low level, Die 0 waits for the first delay time period $t_{dly\_1\_Die\_0}$ (operation step S420). Because no pausing signal (e.g., positive pulse) of the electric potential $V_{ppm}$ is detected at operation step S425 at time $t_3$ (the second timing), the pausing signal is generated according to operation step S430 of the first PPC routine $400_{Die\_0}$ for Die 0. After the second delay time period $t_{ppm}$ (operation step S435), Die 0 can start the first PPO at time $t_4$ (operation step S440). At time $t_5$, Die 0 completes the first PPO and the resuming signal is generated by, for example, driving the electric potential $V_{ppm}$ to the high level (operation step S445).

Between time $t_2$ and time $t_5$, the second PPC routine $400_{Die\_1}$ for Die 1 and the third PPC routine $400_{Die\_2}$ for Die 2 are paused at respective operation steps S450. When the resuming signal is detected at time $t_5$ (operation step S455), the second PPC routine $400_{Die\_1}$ for Die 1 and the third PPC routine $400_{Die\_2}$ for Die 2 can both be resumed. According to the respective operation steps S460 in the second PPC routine $400_{Die\_1}$ for Die 1 and the third PPC routine $400_{Die\_2}$ for Die 2, the electric potential $V_{ppm}$ is driven to the low level at time $t_6$. It is noted that a duration between the rising edge generated according to the first PPC routine $400_{Die\_0}$ for Die 0 at time $t_5$ and the falling edge generated according to the second PPC routine $400_{Die\_1}$ for Die 1 and the third PPC routine $400_{Die\_2}$ for Die 2 at time $t_6$ is longer than a pulse width of the positive pulse (i.e., the pausing signal) generated according to the first PPC routine $400_{Die\_0}$ for Die 0 at time $t_3$. By driving the electric potential $V_{ppm}$ to the low level, other PPC routines 400 for other memory dies in the same PPM group cannot pass the first check point (at operation step S410). As such, memory dies (e.g., Die 1 and Die 2) that have paused at operation step S450 can subsequently complete the second PPO and the third PPO without further delay.

Next, the second PPC routine 400$_{Die\_1}$ for Die 1 and the third PPC routine 400$_{Die\_2}$ for Die 2 proceed to respective operation steps S420, where Die 1 waits for the first delay time period $t_{dly\_1\_Die\ 1}$ and Die 2 waits for the first delay time period $t_{dly\_1\_Die\ 2a}$. In this example, the first delay time period $t_{dly\_1\_Die\ 1}$ of Die 1 is shorter than the first delay time period $t_{dly\_1\_Die\ 2a}$ of Die 2. Accordingly, the second PPC routine 400$_{Die\_1}$ for Die 1 arrives at operation step S425 before the third PPC routine 400$_{Die\_2}$ for Die 2. When it is determines that there is no pausing signal in the electric potential $V_{ppm}$, the pausing signal (i.e., positive pulse) is generated in the electric potential $V_{ppm}$ at time $t_7$ (the fourth timing) according to operation step S430 of the second PPC routine 400$_{Die\_1}$ for Die 1.

While the third PPC routine 400$_{Die\_2}$ for Die 2 is waiting for the first delay time period $t_{dly\_1\_Die\ 2a}$ at the operation step S420, the pausing signal in the electric potential $V_{ppm}$ is detected (operation step S425). In this example, the pausing signal triggers the third PPC routine 400$_{Die\_2}$ for Die 2 to pause at operation step S450, before completing the first delay time period $t_{dly\_1\_Die\ 2a}$.

While the third PPC routine 400$_{Die\_2}$ for Die 2 is paused, the second PPC routine 400$_{Die\_1}$ for Die 1 continues to operations step S435. After waiting for the second delay time period $t_{ppm}$ (operation step S435), Die 1 then starts the second PPO at operation step S440. At time $t_8$, Die 1 completes the second PPO and the resuming signal is generated by, for example, driving the electric potential $V_{ppm}$ to the high level, according to operation step S445 the second PPC routine 400$_{Die\_1}$. By now, Die 0 and Die 1 have completed the first PPO and the second PPO, respectively, and the first PPC routine 400$_{Die\_0}$ for Die 0 and the second PPC routine 400$_{Die\_1}$ for Die 1 are both completed.

When the resuming signal is detected (e.g., at the rising edge of the electric potential $V_{ppm}$) at time $t_8$ according to operation step S455, the third PPC routine 400$_{Die\_2}$ for Die 2 resumes. At operation step S460, the electric potential $V_{ppm}$ is driven to the low level to prevent other memory dies in the same PPM group 203 to start the PPO or the PPC routine 400.

Die 2 then waits for the first delay time period $t_{dly\_1\_Die\ 2b}$ at operation step S420. In this example, the first delay time period $t_{dly\_1\_Die\ 2b}$ is different from the first delay time period $t_{dly\_1\_Die\ 2a}$ because the first delay time periods $t_{dly\_1\_Die\ 2b}$ and $t_{dly\_1\_Die\ 2a}$ are randomly generated. In some embodiments, the first delay time periods $t_{dly\_1\_Die\ 2b}$ and $t_{dly\_1\_Die\ 2a}$ can be the same for Die 2 as long as the first delay time period is unique to each memory die in the same PPM group 203. When it is determined that there is no pausing signal in the electric potential $V_{ppm}$, the pausing signal is generated at time $t_9$ according to operation step S430 of the third PPC routine 400$_{Die\_2}$. After waiting for the second delay time period $t_{ppm}$ (operation step S435), Die 2 can start the third PPO at operation step S440. At time $t_{10}$, Die 2 completes the third PPO and the resuming signal is generated by, for example, driving the electric potential $V_{ppm}$ to the high level (operation step S445).

By using the PPC routine 400, multiple memory dies can coordinate their PPOs through their PPM circuits 202. By regulating the electric potential $V_{ppm}$ shared by the PPM contact pads 204 of the PPM circuits 202 in the same PPM group 203, PPOs can be de-synchronized for the memory dies.

FIG. 10 illustrates another exemplary implementation of the PPC routine 400, according to some embodiments of the present disclosure. In FIG. 10, Die 0 (the first NAND memory die), Die 1 (the second NAND memory die) and Die 2 (the third NAND memory die) receive the command signals for the first PPO, the second PPO and the third PPO simultaneously from the NAND storage system 10. The first PPC routine 400$_{Die\_0}$, the second PPC routine 400$_{Die\_1}$ and the third PPC routine 400$_{Die\_2}$ arrive at the first check point (operation step S410) at the same time. When the electric potential $V_{ppm}$ is determined to be held at the first voltage level (i.e., the high level), the electric potential $V_{ppm}$ is thereby driven to the second voltage level (i.e, the low level) at time $t_1$ (the first timing) at operation step S415. Die 0, Die 1 and Die 2 then wait for the respective first delay time period $t_{dly\_1\_Die\ 0}$, $t_{dly\_1\_Die\ 1a}$ and $t_{dly\_1\_Die\ 2a}$ at operation step S420.

In the example in FIG. 10, the first delay time period $t_{dly\_1\_Die\ 0}$ for Die 0 is the shortest. As such, Die 0 completes operation step S420 before Die 1 or Die 2. When it is determined at time $t_3$ (the second timing) that there is no pausing signal (e.g., the positive pulse) in the electric potential $V_{ppm}$ at the second check point according to operation step S425 of the first PPC routine 400$_{Die\_0}$ for Die 0, the pausing signal is generated according to operation step S430.

While Die 1 and Die 2 are performing the operation step S420, i.e., waiting for the first delay time period $t_{dly\_1\_Die\ 1a}$ and $t_{dly\_1\_Die\ 2a}$, respectively, both Die 1 and Die 2 detect the pausing signal in the electric potential $V_{ppm}$ (operation step S425), which triggers both Die 1 and Die 2 to start operation step S450 and pause the second PPC routine 400$_{Die\_1}$ and the third PPC routine 400$_{Die\_2}$ before completing the first delay time period $t_{dly\_1\_Die\ 1a}$ and $t_{dly\_1\_Die\ 2a}$, respectively.

While the second PPC routine 400$_{Die\_1}$ for Die 1 and the third PPC routine 400$_{Die\_2}$ for Die 2 are paused, the first PPC routine 400$_{Die\_0}$ for Die 0 continues to operation step S435, where Die 0 waits for the second delay time period $t_{ppm}$. Die 0 then starts the first PPO at operation step S440 at time $t_4$. When Die 0 completes the first PPO at time $t_5$, the resuming signal is generated by, for example, driving the electric potential $V_{ppm}$ to the high level, according to operation step S445 of the first PPC routine 400$_{Die\_0}$.

When Die 1 and Die 2 detect the resuming signal (e.g., the rising edge of the electric potential $V_{ppm}$) at operation step S455, the second PPC routine 400$_{Die\_1}$ for Die 1 and the third PPC routine 400$_{Die\_2}$ for Die 2 resume and proceed to operation step S460, where the electric potential $V_{ppm}$ is driven to the low level at time $t_6$. Next, both Die 1 and Die 2 perform the operation step S420, where Die 1 waits for the first delay time period $t_{dly\_1\_Die\ 1b}$ and Die 2 waits for the first delay time period $t_{dly\_1\_Die\ 2b}$. In this example, the first delay time period is generated randomly as such the first time period $t_{dly\_1\_Die\ 1a}$ and $t_{dly\_1\_Die\ 1b}$ are different for Die 1, and the first time period $t_{dly\_1\_Die\ 2}a$ and $t_{dly\_1\_Die\ 2}b$ are different for Die 2. In some embodiments, the first delay time period $t_{dly\_1\_Die\ 1a}$ and $t_{dly\_1\_Die\ 1b}$ can be the same for Die 1 and the first time period $t_{dly\_1\_Die\ 2a}$ and $t_{dly\_1\_Die\ 2b}$ can be the same for Die 2. In this example, the first time period $t_{dly\_1}$ can be predetermined by the NAND storage system 10 as long as it is unique for each memory die.

In the example in FIG. 10, the first delay time period $t_{dly\_1\_Die\ 1b}$ for Die 1 is shorter than the first delay time period $t_{dly\_1\_Die\ 2b}$ for Die 2. Accordingly, Die 1 starts operation step S425 (i.e., the second check point) before Die 2. According to operation step S425 of the second PPC routine $400_{Die\_1}$ for Die 1, it is determined whether there is the pausing signal in the electric potential $V_{ppm}$ at time $t_7$ (the fourth timing). When the pausing signal is not detected, the pausing signal of the electric potential $V_{ppm}$ is then generated (operation step S430). Subsequently, the pausing signal generated by Die 1 triggers Die 2 to stop operation step S420 and pause the third PPC routine $400_{Die\_2}$ at operation step S450.

For Die 1, after waiting for the second delay time period $t_{ppm}$ (operation step S435), Die 1 can start the second PPO at operation step S440 at time $t_8$. When Die 1 completes the second PPO, the resuming signal is generated by, for example, driving the electric potential $V_{ppm}$ to the high level at time $t_9$, according to the operation step S445 of the second PPC routine $400_{Die\_1}$.

When Die 2 detects the resuming signal generated by Die 1 while pausing at operation step S450, the third PPC routine $400_{Die\_2}$ for Die 2 resumes and proceeds to operation step S460 where the electric potential $V_{ppm}$ is driven to the low level. Die 2 then perform the operation step S420 and waits for the first delay time period $t_{dly\_1\_Die\ 2c}$. The third PPC routine $400_{Die\_2}$ for Die 2 continues to operation step S425 (i.e., the second check point). As discussed previously, Die 2 checks for the pausing signal in the electric potential $V_{ppm}$ and generates the pausing signal at time $t_{10}$ when it is not detected (operation step S430). After waiting for the second delay time period $t_{ppm}$ (operation step S435), Die 2 starts the third PPO at operation step S440. When Die 2 completes the third PPO, the resuming signal is generated by, for example, driving the electric potential $V_{ppm}$ to the high level at time $t_{11}$, according to operation step S445. At this time, all three memory dies Die 0, Die 1 and Die 2 have completed the PPOs one by one.

In summary, the present disclosure provides a method of peak power management (PPM) for multiple NAND memory dies. The multiple NAND memory dies have a first NAND memory die and a second NAND memory die, and each of the first NAND memory die and the second NAND memory die includes a PPM circuit having a PPM contact pad held at an electric potential common between the first NAND memory die and the second NAND memory die. The method includes the following steps: detecting the electric potential of the PPM contact pad at a first timing during a first peak power check (PPC) routine for the first NAND memory die; driving the electric potential of the PPM contact pad to a second voltage level if the detected electric potential is at a first voltage level at the first timing, wherein the second voltage level is lower than the first voltage level; enabling the first NAND memory die to wait for a first delay time period; determining whether there is a pausing signal in the electric potential of the PPM contact pad at a second timing during the first PPC routine for the first NAND memory die, wherein the second timing is later than the first timing; generating the pausing signal in the electric potential of the PPM contact pad to pause a second PPC routine for the second NAND memory die if no pausing signal is detected at the second timing; enabling the first NAND memory die to perform a first peak power operation; and generating a resuming signal in the electric potential of the PPM contact pad to resume the second PPC routine for the second NAND memory die after the first NAND memory die completes the first peak power operation.

Another aspect of the present disclosure provides a peak power management (PPM) circuit for managing peak power operations between multiple NAND memory dies in a memory chip. The PPM circuit has a PPM contact pad held at an electric potential common between the PPM circuit disposed on a first NAND memory die and the PPM circuit disposed on a second NAND memory die. The PPM circuit is configured to detect the electric potential of the PPM contact pad at a first timing during a first peak power check (PPC) routine for the first NAND memory die; drive the electric potential of the PPM contact pad to a second voltage level if the detected electric potential is at a first voltage level at the first timing, wherein the second voltage level is lower than the first voltage level; enable the first NAND memory die to wait for a first delay time period; determine whether there is a pausing signal in the electric potential of the PPM contact pad at a second timing during the first PPC routine for the first NAND memory die, wherein the second timing is later than the first timing; generate the pausing signal in the electric potential of the PPM contact pad to pause a second PPC routine for the second NAND memory die if no pausing signal is detected at the second timing; enable the first NAND memory die to perform a first peak power operation; and generate a resuming signal in the electric potential of the PPM contact pad to resume the second PPC routine for the second NAND memory die after the first NAND memory die completes the first peak power operation.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method of peak power management (PPM) for multiple memory dies comprising a first memory die and a second memory die, wherein the first memory die comprises a first PPM circuit having a single first PPM contact pad, and the second memory die comprises a second PPM circuit having a single second PPM contact pad electrically connected with the single first PPM contact pad such that the single first PPM contact pad and the single second PPM contact pad share an electric potential, the method comprising:
   starting a first peak power check (PPC) routine of the first memory die when the electric potential shared between the single first PPM contact pad and the single second PPM contact pad is at a first voltage level;
   driving the electric potential shared between the single first PPM contact pad and the single second PPM contact pad to a second voltage level lower than the first voltage level at a first timing after starting the first PPC routine;
   enabling the first memory die to wait for a first delay time period;
   generating a pausing signal in the electric potential shared between the single first PPM contact pad and the single second PPM contact pad at a second timing after the first timing;
   performing a first peak power operation of the first memory die; and
   generating a resuming signal in the electric potential shared between the single first PPM contact pad and the single second PPM contact pad at a fifth timing after the first memory die has completed the first peak power operation.

2. The method according to claim 1, wherein the first delay time period is unique for each of the multiple memory dies.

3. The method according to claim 1, wherein the generating of the pausing signal comprises generating a voltage pulse in the electric potential.

4. The method according to claim 3, wherein the voltage pulse comprises a pulse width in a range between 0.1 μs and 10 μs.

5. The method according to claim 3, wherein the voltage pulse is a positive voltage pulse.

6. The method according to claim 1, wherein the generating of the resuming signal comprises driving the electric potential to the first voltage level, wherein the resuming signal comprises a rising edge of the electric potential.

7. The method according to claim 1, further comprising:
   starting a second PPC routine of the second memory die at a third timing after the first timing and before the second timing;
   pausing the second PPC routine when detecting the electric potential is at the second voltage level; and
   resuming the second PPC routine at the fifth timing according to the resuming signal.

8. The method according to claim 7, further comprising:
   starting a third PPC routine of a third memory die after the first timing and before the second timing;
   pausing the third PPC routine when detecting the electric potential is at the second voltage level; and
   resuming the third PPC routine simultaneously with the second PPC routine at the fifth timing according to the resuming signal.

9. The method according to claim 1, further comprising:
   starting a second PPC routine of the second memory die simultaneously with the first PPC routine;
   enabling the second memory die to wait for a second delay time period, wherein the second delay time period is longer than the first delay time period;
   pausing the second PPC routine at the second timing according to the pausing signal; and
   resuming the second PPC routine at the fifth timing according to the resuming signal.

10. The method according to claim 9, further comprising:
after resuming the second PPC routine, driving the electric potential to the second voltage level at a sixth timing;
enabling the second memory die to wait for a fourth delay time period;
generating the pausing signal in the electric potential at a fourth timing after the sixth timing;
performing a second peak power operation of the second memory die; and
generating the resuming signal in the electric potential after the second memory die has completed the second peak power operation.

11. The method according to claim 9, further comprising:
   starting a third PPC routine of a third memory die simultaneously with the first PPC routine and the second PPC routine;
   enabling the third memory die to wait for a third delay time period, wherein the third delay time period is longer than the first delay time period;
   pausing the third PPC routine at the second timing according to the pausing signal; and
   resuming the third PPC routine simultaneously with the second PPC routine at the fifth timing according to the resuming signal.

12. The method according to claim 1, further comprising:
   starting a second PPC routine of the second memory die after the second timing and before the fifth timing;
   pausing the second PPC routine when detecting the electric potential is at the second voltage level; and
   resuming the second PPC routine at the fifth timing according to the resuming signal.

\* \* \* \* \*